(12) United States Patent
Fletcher

(10) Patent No.: US 10,921,706 B2
(45) Date of Patent: Feb. 16, 2021

(54) SYSTEMS AND METHODS FOR MODIFYING MESA SIDEWALLS

(71) Applicant: CANON KABUSHIKI KAISHA, Tokyo (JP)

(72) Inventor: Edward Brian Fletcher, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 274 days.

(21) Appl. No.: 16/002,471

(22) Filed: Jun. 7, 2018

(65) Prior Publication Data
US 2019/0377257 A1 Dec. 12, 2019

(51) Int. Cl.
| | | |
|---|---|---|
| G03F 7/00 | (2006.01) | |
| B29C 35/08 | (2006.01) | |
| B82Y 40/00 | (2011.01) | |
| B82Y 10/00 | (2011.01) | |
| G02B 6/138 | (2006.01) | |
| B29C 59/02 | (2006.01) | |
| B29C 71/00 | (2006.01) | |
| B29C 33/44 | (2006.01) | |
| B29C 33/46 | (2006.01) | |
| B29C 37/00 | (2006.01) | |
| G03F 9/00 | (2006.01) | |

(52) U.S. Cl.
CPC .......... *G03F 7/0002* (2013.01); *B29C 35/08* (2013.01); *B82Y 40/00* (2013.01); *B29C 33/44* (2013.01); *B29C 33/46* (2013.01); *B29C 37/0003* (2013.01); *B29C 37/0067* (2013.01); *B29C 71/0009* (2013.01); *B29C 71/009* (2013.01); *B29C 2037/906* (2013.01); *B29C 2059/023* (2013.01); *B82Y 10/00* (2013.01); *G02B 6/138* (2013.01); *G03F 9/70* (2013.01)

(58) Field of Classification Search
CPC ............................. G03F 7/0002; G03F 7/167
See application file for complete search history.

(56) References Cited

U.S. PATENT DOCUMENTS

| | | |
|---|---|---|
| 6,936,194 B2 | 8/2005 | Watts |
| 7,157,036 B2 | 1/2007 | Choi et al. |
| 7,473,090 B2 | 1/2009 | McMackin et al. |
| 7,846,266 B1 | 12/2010 | Dibiase |
| 8,012,395 B2 | 9/2011 | Selinidis et al. |
| 8,066,930 B2 | 11/2011 | Sreenivasan et al. |
| 8,076,386 B2 | 12/2011 | Xu et al. |
| 8,202,463 B2 | 6/2012 | Yoneda et al. |
| 8,268,220 B2 | 9/2012 | Xu et al. |
| 8,346,241 B2 | 1/2013 | Sreenivasan et al. |
| 8,394,203 B2 | 3/2013 | Schmid et al. |
| 8,522,802 B2 | 9/2013 | Nakashima et al. |
| 8,641,941 B2 | 2/2014 | Fletcher et al. |

(Continued)

OTHER PUBLICATIONS

Mehul N. Patel, Edward Brian Fletcher, Seth J. Bamesberger, Alireza Aghili, U.S. Appl. No. 16/106,147, filed Aug. 21, 2018.

*Primary Examiner* — Benjamin A Schiffman
(74) *Attorney, Agent, or Firm* — Daniel Ratoff

(57) ABSTRACT

An apparatus, method, or platter for modifying mesa sidewalls of a template by cleaning or coating the mesa sidewalls. In which the template has a pattern area on a first surface of a mesa. Mesa sidewalls surround the first surface of the mesa. The mesa sidewalls are exposed to a gas. The gas modifies the mesa sidewalls. Resistance to the flow of gas towards the pattern area is provided.

14 Claims, 12 Drawing Sheets

(56) References Cited

U.S. PATENT DOCUMENTS

| | | |
|---|---|---|
| 9,050,633 B2 | 6/2015 | Horibe |
| 9,063,409 B2 | 6/2015 | Khusnatdinov et al. |
| 9,108,343 B2 | 8/2015 | Ota |
| 9,164,377 B2 | 10/2015 | Tomita et al. |
| 9,475,213 B2 | 10/2016 | Kobayashi et al. |
| 2008/0203271 A1 | 8/2008 | Okinaka et al. |
| 2009/0038636 A1 | 2/2009 | Wuister et al. |
| 2009/0140458 A1* | 6/2009 | Xu .................. B82Y 10/00 264/293 |
| 2010/0072671 A1* | 3/2010 | Schmid ............. G03F 7/0002 264/402 |
| 2010/0084376 A1* | 4/2010 | Khusnatdinov ...... B32B 37/14 216/39 |
| 2010/0109201 A1* | 5/2010 | Fletcher ............. B82Y 10/00 264/334 |
| 2011/0140304 A1 | 6/2011 | Choi et al. |
| 2012/0070572 A1* | 3/2012 | Ye .................. B82Y 40/00 427/207.1 |
| 2012/0201969 A1 | 8/2012 | Fletcher et al. |
| 2013/0200553 A1 | 8/2013 | Yamada et al. |
| 2013/0224322 A1 | 8/2013 | Shizawa et al. |
| 2014/0083454 A1 | 3/2014 | Wakamatsu et al. |
| 2015/0136173 A1 | 5/2015 | Yamada et al. |
| 2015/0165650 A1 | 6/2015 | Miyajima et al. |
| 2016/0001492 A1 | 1/2016 | Yamaguchi et al. |
| 2018/0016673 A1 | 1/2018 | Nakamura et al. |
| 2019/0101823 A1* | 4/2019 | Patel ................. G03F 7/0002 |
| 2020/0026183 A1* | 1/2020 | Fletcher ............. G03F 7/0002 |

\* cited by examiner

SYSTEMS AND METHODS FOR MODIFYING MESA SIDEWALLS

BACKGROUND

Field of Art

The present disclosure relates to systems and methods for modifying mesa sidewalls of a temple while protecting a patterning surface of the template from modification.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the formation of a relief pattern in a formable material (polymerizable) layer and transferring a pattern corresponding to the relief pattern into and/or onto an underlying substrate. The patterning process uses a template spaced apart from the substrate and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

The relief pattern of the template is or becomes coated with a release layer which aids in separating the template from the solidified layer. The release layer may contain low surface energy groups which are replenished during the imprinting step as described in U.S. Pat. No. 8,268,220. The patterning surface is on a mesa of the template. The mesa is surrounded by a recessed surface. Sidewalls connect the recessed surface to the mesa. During the imprinting process formable liquid occasionally extrudes out from the imprint field and attaches to the sidewalls forming extrusions. These extrusions can cause damage in latter imprinting steps.

SUMMARY

At least a first embodiment, may be an apparatus comprising: a template chuck; a platter; and a positioning system. The template chuck may be configured to hold a template. The positioning system, during a first period of time, may be configured to position the template chuck and the platter at a first position relative to each other. The template has a pattern area on a first surface of a mesa. Mesa sidewalls surround the first surface of the mesa. The apparatus may be configured to expose the mesa sidewalls to a first gas. The first gas may be configured to modify the mesa sidewalls during the first period. The first position may be such that the platter provides resistance to flow of the first gas towards the pattern area of the template during the first period.

In an aspect of the first embodiment, the first position may be such that a first gap may be formed, wherein the first gap is bounded by at least, the platter, the mesa sidewalls, and a recessed surface of the template. The apparatus may further comprise: a gas controller; and a first set of one or more ports. The gas controller may be configured to supply the first gas. The first set of one or more ports may connect the gas controller to the first gap.

In an aspect of the first embodiment, the first position may be such that a second gap may be formed between the platter and the pattern area of the template. The second gap may provide resistance to the flow of the first gas in the first gap into the second gap.

In an aspect of the first embodiment, at least a portion of the platter may have a removable coating and the first position may be such that the removable coating contacts the pattern area.

In an aspect of the first embodiment, the first set of one or more ports may be in one or both of the template held in the template chuck and the platter.

In an aspect of the first embodiment, the first gas may be a reactive gas that either removes material from the mesa sidewalls or forms a first coating on the mesa sidewalls. The platter may be configured to provide resistance to the flow of the reactive gas towards a second coating on the pattern area.

In an aspect of the first embodiment, the first gas may be a precursor gas that may become a reactive gas when exposed to ionizing radiation at which point the reactive gas may react with material on the mesa sidewalls so as to remove material from the mesa sidewalls. The mesa sidewalls may be exposed to the ionizing radiation. The platter may protect the pattern area from the ionizing radiation when in the first position.

In an aspect of the first embodiment, the apparatus may further comprising an ionizing radiation source.

In an aspect of the first embodiment the apparatus may further comprise exhaust ports for pulling gas from the first gap.

In an aspect of the first embodiment, the platter may include wells. The wells may include a precursor material. The precursor material in the well may produce the first gas during the first period. The platter may be configured to prevent the material in the well from producing the first gas prior to the first period.

In an aspect of the first embodiment, the positioning system may be further configured to form a first gap. The first gap is bounded by at least: the mesa sidewalls of the template; a recessed surface of the template; and the platter. The platter may include one or more wells for storing a material which produces the first gas in the first gap.

A second embodiment may be a platter. The platter may comprise: a raised area; a first region surrounding the raised area region; and a first gas source in the first region. The first gas source may be configured to supply a first gas to the first region. The first gas source may include at least one gas port or at least one liquid well.

In an aspect of the second embodiment, the platter may further comprise channel structures which provides resistance to the flow of the first gas away from the center of the platter.

In an aspect of the second embodiment, the platter may further comprise a second set of one or more gas ports configured to supply a second gas different from the first gas, to the raised area.

In an aspect of the second embodiment, the platter may further comprise channels in the raised area that may be connected to the second set of one or more gas ports which guide the second gas towards edges of the raised area.

A third embodiment, may be a method for modifying mesa sidewalls of a template. The template has a pattern area on a mesa. The pattern area is surrounded by mesa sidewalls. A recessed surface of the template is connected to the mesa sidewalls. The recessed surface surrounds the mesa sidewalls. The method may comprising: positioning the template; and modifying the mesa sidewalls. The template and the platter may be positioned into a first position relative to each other at a start of a first period, forming a first gap. The first gap may be formed between the template and a platter when the template and the platter may be in the first position. The first gap is bounded by at least: the platter, the mesa sidewalls, and the recessed surface. The mesa sidewalls may be modified with a reactive gas in the first gap during the first period. During the first period, the platter may be configured to protect the pattern area from the reactive gas.

In an aspect of the third embodiment, the reactive gas may modify the mesa sidewalls by applying a coating to the mesa sidewalls and the reactive gas does not apply a coating to the pattern area.

In an aspect of the third embodiment, the reactive gas modifies the mesa sidewalls of the template by removing material on the mesa sidewalls and the reactive gas does not react with the pattern area.

In an aspect of the third embodiment, the method may further comprise flowing the reactive gas into the first gap during the first period. The method may also further comprise purging the reactive gas from the first gap after the first period, by one or both of: flowing a non-reactive gas into the first gap, or exhausting the reactive gas from the first gap. The method may further comprise after the first period, positioning the template and the platter into a second position relative to each other. In the second position the platter is not configured to protect the pattern area from any gases that may be between the template and the platter.

In an aspect of the third embodiment, a non-reactive gas may be flown into the second gap during the first period, wherein the second gap may be formed between the pattern area and the platter.

In an aspect of the third embodiment, the reactive gas near the mesa sidewall may be formed by exposing a precursor gas adjacent to the mesa sidewalls to ionizing radiation through one or more windows in one or both of the platter and the template during the first period.

In an aspect of the third embodiment, the precursor gas may be a mixture of oxygen and water vapor.

The third embodiment may be included as part of an imprinting method. The imprinting method may include modifying the mesa sidewalls of the template in accordance with the third embodiment. The imprinting method may also include imprinting formable material on a substrate using the template with the mesa sidewalls which were modified. The imprinting method may also include curing the formable material that has been imprinted forming a patterned layer on the substrate.

The imprinting method may be included as part of an article manufacturing method. The article manufacturing method may include the imprinting the substrate according to imprinting method which includes the modifying the mesa sidewalls in accordance with the third embodiment. The article manufacturing method may also include processing the patterned layer on the substrate so as to obtain one or more article from the substrate.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Figure 1:
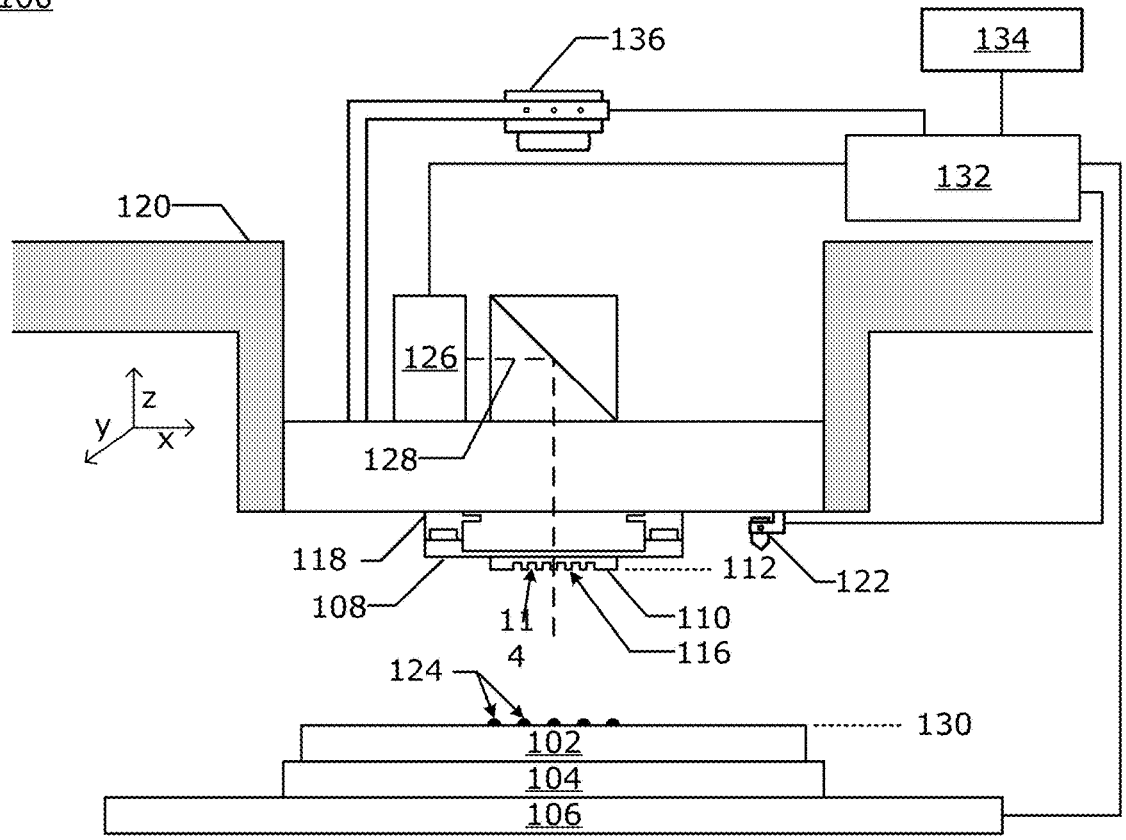
FIG. 1 is an illustration of a nanoimprint lithography system having a template and a mold spaced apart from a substrate.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

What is needed is a system and/or method that prevents extrusions from forming on the sidewalls or removing extrusions from sidewalls while protecting the pretreated patterning surface.

Nanoimprint System

FIG. 1 is an illustration of a nanoimprint lithography system 100 in which an embodiment may be implemented. The nanoimprint lithography system 100 is used to form a relief pattern on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102. The mesa 110 may have a patterning surface 112 thereon. Alternatively, the template 108 may be formed without the mesa 110, in which case the surface of the template facing the substrate 102 is equivalent to the mold 110 and the patterning surface 112 is that surface of the template 108 facing the substrate 102.

The template 108 and/or the mold 110 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 comprises features defined by a plurality of spaced-apart template recesses 114 and/or template protrusions 116, though embodiments of the present invention are not limited to such configurations (e.g., planar surface). The patterning surface 112 defines a pattern that forms the basis of a pattern to be formed on the substrate 102. In an alternative embodiment, the patterning surface 112 is featureless in which case a planar surface is formed on the substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may be coupled to an imprint head which in turn may be moveably coupled to a bridge 120 such that the template chuck 118, the imprint head, and the template 108 are moveable in at least the z-axis direction, and potentially other directions (e.g. x, y, θ, and φ-axes). The positioning system may include one or more motors which move template 108.

Nanoimprint lithography system 100 may further comprise a fluid dispenser 122. The fluid dispenser 122 may also be moveably coupled to the bridge. In an embodiment, the fluid dispenser 122 and the template chuck 120 share one or more positioning components. In an alternative embodiment, the fluid dispenser 122 and the template chuck 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, and piezoelectric ink jetting are common techniques for dispensing jettable liquids.

The nanoimprint lithography system 100 may further comprise an energy source 126 that directs actinic energy along an exposure path 128. The Imprint head and the substrate positioning stage 106 may be configured to position the template 108 and the substrate 102 in superimposition with the exposure path 128. A camera 136 may likewise be positioned such that an imaging field of the camera 128 is in superimposition with the exposure path 128.

The nanoimprint lithography system 100 may be regulated, controlled and/or directed by one or more processors 132 (controller) in communication with one or more components and/or subsystems such as the substrate positioning stage 106, the imprint head, the fluid dispenser 122, the source 126, and/or the camera 136 and may operate based on instructions in a computer readable program stored in a non-transitory computer readable memory 134. The processor 132 may be or include one or more of a CPU, MPU, GPU, ASIC, FPGA, DSP, and a general purpose computer. The processor 132 may be a purpose built controller or may be a general purpose computing device that is adapted to be a controller. Examples of a non-transitory computer readable memory includes but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head, the substrate positioning stage 106, or both varies a distance between the mold 110 and the substrate 102 to define a desired volume that is filled by the formable material 124. For example, the imprint head may apply a force to the template 108 such that mold 110 is in contact with the formable material 124. After the desired volume is filled with the formable material 124, the source 126 produces energy, e.g., actinic radiation (UV), causing formable material 124 to cure, solidify, and/or cross-link conforming to a shape of the substrate surface 130 and the patterning surface 112, defining a patterned layer on the substrate 102. The formable material 124 is cured while the template 108 is in contact with formable material 124 forming the patterned layer on the substrate 102. Thus the nanoimprint lithography system 100 uses an imprinting process to form the patterned layer which has recesses and protrusions which are an inverse of the pattern in the patterning surface 112.

The imprinting process may be done repeatedly in a plurality of imprint fields that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include fluid control features which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) above a highest point on the substrate surface 130 in each imprint field. The patterned layer may also include one or more features such as protrusions which extend above the residual layer having a thickness. These protrusions match the recesses 114 in the mesa 110.

Template

Figure 2:
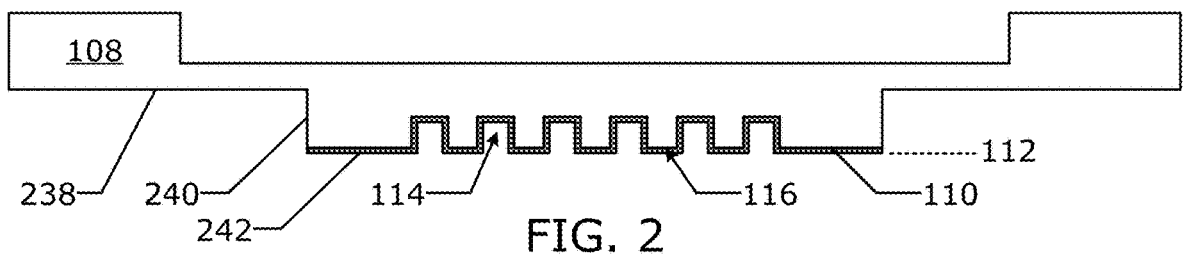
FIG. 2 is an illustration of a template with mesa sidewalls which is may be modified in an embodiment.

FIG. 2 is an illustration of a template 108 that may be used in an embodiment. The patterning surface 112 is on a mesa 110. The mesa 110 is surrounded by a recessed surface 238. Mesa sidewalls 240 connect the recessed surface 238 to a top surface of the mesa 110. The mesa sidewalls 240 surround the mesa 110. In an embodiment in which the mesa is round or has rounded corners, the mesa sidewalls refers to a single mesa sidewall that is a continuous wall without corners. The template 108 also includes a patterning surface coating 242 on the patterning surface 112. The patterning surface coating may be a monolayer of a release agent that is constantly replenished during the imprinting process as described in U.S. Pat. No. 8,268,220.

Extrusions

Figure 3:
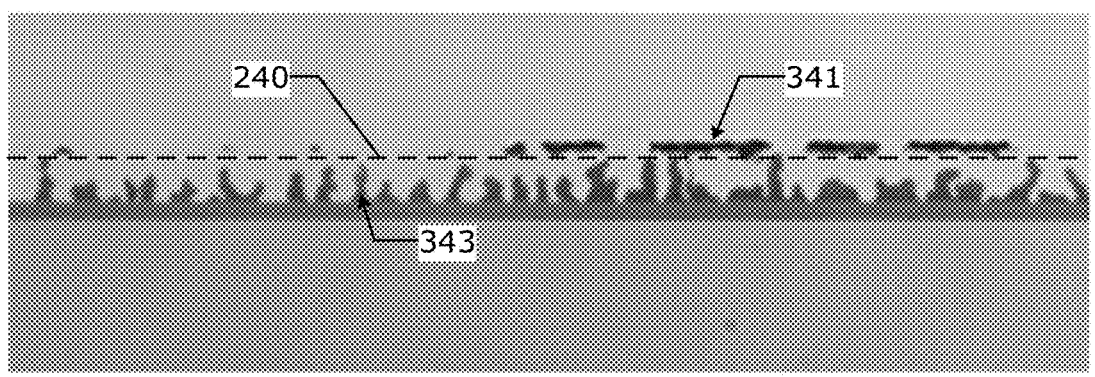
FIG. 3 is a micrograph illustrating extrusions that have detached from a mesa sidewall and adhered to a substrate.

During the imprinting process a single template 108 may be used to imprint a plurality of imprint fields over a plurality of substrates (wafers) in a step and repeat process. During the imprinting process, formable material 124 accumulates as an extrusion on the mesa sidewalls 240 via one or both seepage or vapor deposition. FIG. 3 is a micrograph of finger projections 343 of cured formable material that are partially filling a fluid control feature that borders the mesa sidewalls 240. The location of the mesa sidewall 240 is represented as a dashed line overlaid on top of the micrograph. The finger projections 343 are within the mesa. The finger projections do not typically extend beyond the mesa sidewall 240. When extrusions do extend beyond the mesa sidewall they form extrusions 341 which eventually fall off and form defects on the substrate as illustrated in FIG. 3.

Figure 4A:
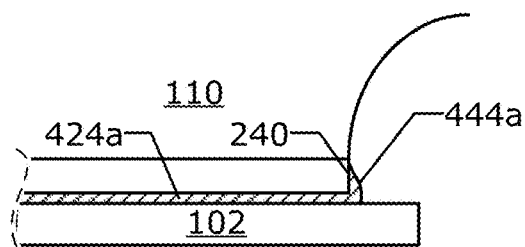
FIGS. 4A-4E are illustrations of how extrusions are formed and the damage they can cause.

FIG. 4A is an illustration of a mesa 110 in contact with the formable material 124 forming a liquid layer 424a in a first imprint field on the substrate 102. In FIG. 4A some of the formable material leaks out and forms a small liquid extrusion 444a.

Figure 4B:
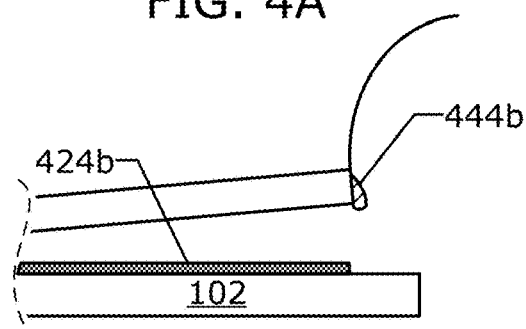

FIG. 4B is an illustration of the mesa 110 being pulled up from a solid layer 424b. The solid layer 424b may be a cured or partially cured layer. The shape of the solid layer 424b will conform to the shape of the patterning surface 112. Sometimes, an extrusion 444a becomes an attached extrusion 444b as illustrated in FIG. 4B. The attached extrusion 444b may be liquid, partially cured, or fully cured. The extrusion whether or not it fully attaches to the mesa sidewall or the substrate can leave some residue of the formable material on the mesa sidewall where it was in contact with the mesa sidewall.

Figure 4C:
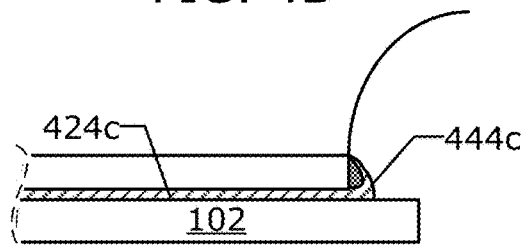
Figure 4D:
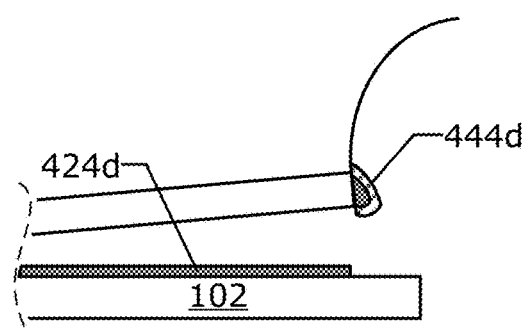

FIG. 4C is an illustration of the mesa 110 imprinting another liquid layer 424c in a subsequent imprint field. Once an extrusion or other residue has attached itself to the mesa sidewall 240 it acts as a seed for additional extrusions, additional material 444c starts to gather on the attached extrusion 444b causing it grow as illustrated in FIGS. 4C-D.

Figure 4E:
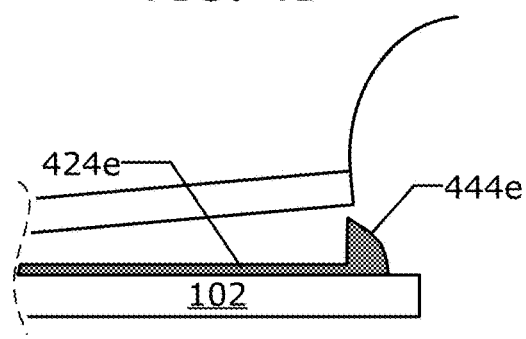

The liquid layer 424c in the subsequent imprint field is exposed to actinic radiation which causes it to polymerize and form the solid layer 424d. The exposure to actinic radiation also causes the attached extrusions to polymerize and harden. This process repeats causing the extrusion to grow as illustrated in FIG. 4D. The growing extrusion continues to adhere to the mesa sidewall 240. Eventually the extrusion will become large enough and detach from the mesa sidewall 240 forming a defect 444e that becomes a part of solid layer 424e as illustrated in FIG. 4E. The defect 444e can potentially cause a defect in subsequent pattern transfer processes which can ultimately affect device yield.

Figure 5A:
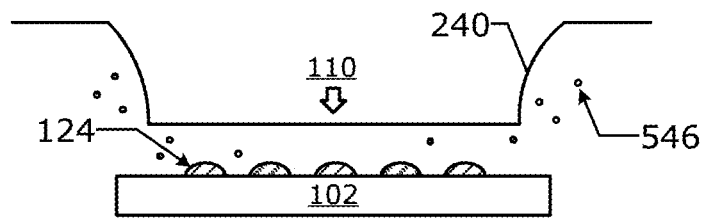
FIGS. 5A-5D are additional illustrations of how extrusions are formed and the damage they can cause.
Figure 5B:
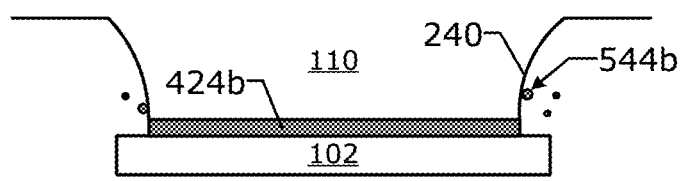
Figure 5C:
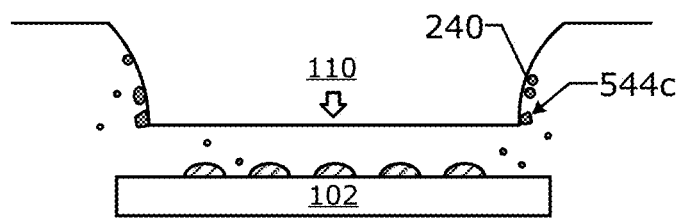
Figure 5D:
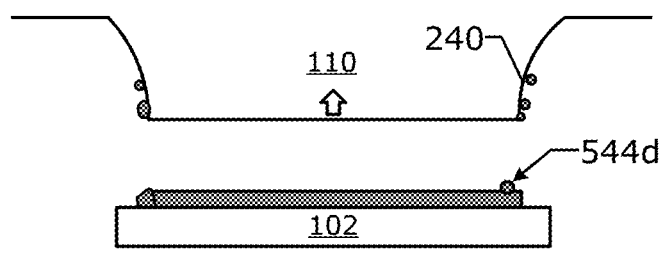

FIGS. 5A-5D are illustrations of a different mechanism by which extrusions are formed on the mesa sidewalls 240. FIG. 5A is an illustration of a mesa 110 with sidewalls 240 that is used to imprint formable material 124 in a first imprint field on the substrate 102. A nanoimprint lithography system 100 may use a formable material 124 that has a vapor pressure which produces vapor 546. FIG. 5B is an illustration of the template in contact with the liquid layer 424b, while the vapor 544b coats the mesa sidewall 240. During subsequent imprints the vapor continues to accumulate producing attached extrusions 544c as illustrated in FIG. 5C. Over time the accumulated extrusions can cure and adhere to the substrate 102 as a defect 544d. The extrusions may also fall onto the substrate 102 from the mesa sidewall 240.

These extrusions and defects can cause problems and create fatal defects in the current process and/or subsequent processes. The applicant has determined that if theses extrusions are removed from the mesa sidewalls 240 while leaving the patterning surface coating 242 intact then the performance and throughput of the imprinting process can be improved.

Mesa Sidewall Cleaning

The applicant has found that it is advantageous to remove these extrusions from the mesa sidewalls 240. Previous efforts to remove extrusions from the mesa sidewalls 240 would sometimes or always damage the patterning surface coating 242.

Figure 6A:
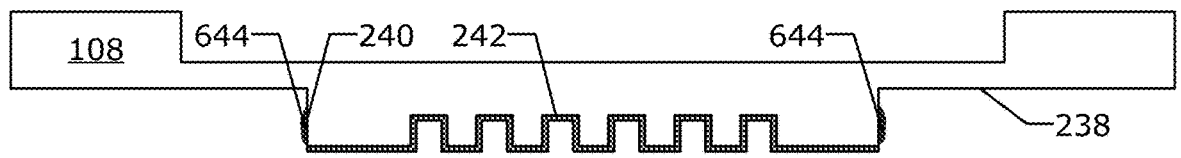
FIGS. 6A-6M are illustrations of embodiments which are used to clean mesa sidewalls in embodiments.

FIG. 6A is a block diagram of a mesa sidewall cleaning (modifying) apparatus 600 that includes a platter 648, a positioning system 650, and one or both of a gas source 652 and an ionizing radiation source 654.

Figure 6B:
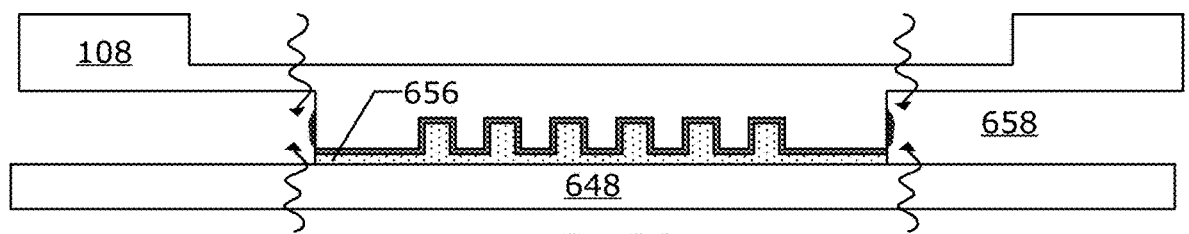

FIG. 6B is an illustration of a template 108 with a patterning surface coating 242 and extrusions 644 which have formed on the mesa sidewalls 240 which may be cleaned in an embodiment.

In an embodiment, as the platter is heated by the mesa sidewall cleaning and/or modifying process, the template 108 may be actively cooled to counteract the heating from the platter and the cleaning process during or after the mesa sidewall is modified. Liquid, air, and/or thermoelectric cooling may be used to extract heat from the template.

In an embodiment, the platter 648 is attached to the substrate chuck 104 of the nanoimprint lithography system 100 during the mesa sidewall cleaning process. In an alternative embodiment, the platter 648 is attached to a platter chuck in the nanoimprint lithography system 100. In an embodiment, the platter 648 is part of a mesa sidewall modifying apparatus that is separate from the nanoimprint lithography system 100. In an alternative embodiment, the mesa sidewall modifying apparatus may share one or more components of the nanoimprint lithography system 100. Examples of components that may be shared are but are not limited to: the template chuck; one or more positioning stages; substrate chucks; gas supply components; etc.

Cleaning the mesa sidewalls with this apparatus which may be integrated into the nanoimprint lithography system 100, improves productivity of the nanoimprint lithography system 100, by preventing or prolonging the onset of extrusions that require the template 108 to be removed from the nanoimprint lithography system 100. Replacing a template in the imprinting system may include unloading the template, loading, registering, leveling, and priming the new template. Priming the new template may include preparing the template's surface chemistry.

In an embodiment, the mesa sidewalls 240 may be cleaned on a periodic basis in a manner which does not affect the patterning surface coating 242. If the active-area surface chemistry can be maintained so that the template does not require priming again, then this increases the productivity of the nanoimprint lithography system 100.

In an embodiment, the nanoimprint lithography system 100 is the cleaning system and during the course of device substrate processing, after some number of device substrates are processed, the platter 648 is loaded onto the substrate chuck 104. The ionizing radiation source 654 and/or the gas source may also be incorporated into the nanoimprint lithography system 100.

The Platter

The platter 648 may include one or more features that allow the platter 648 to protect the patterning surface coating 242. The platter 648 may be fabricated and coated with materials (oxides, nitrides, carbides, perfluoropolymer, and/or metals (aluminum, silicon, chrome, tungsten, and/or tantalum) that form an oxidation resistant native oxide) that are non-reactive to the cleaning process conditions.

In an embodiment, the platter 648 is a non-yielding semiconductor device product substrate. In an embodiment, the platter 648 is a silicon wafer, patterned or un-patterned, coated with an adhesion layer, or some other stack, such as an adhesion layer coated on top of a spin on carbon (SOC) layer or a spin on glass (SOG) layer. In an embodiment, the platter 648 may be a planar substrate that is planar for at least the length of the template 108 and extend further, such as beyond the template chuck 118 and/or mag control hardware that is used to stretch and squeeze the template.

In an embodiment, the platter 648 has protrusions and/or recesses which facilitates: direction of gas flow; containment of gas; rate of local gas flow; and evacuation of gas from the mesa sidewall 240 and the first gap 658.

In an embodiment, the platter 648 is divided into a plurality of non-adjacent cleaning fields, and each cleaning field on the platter 648 is only used once.

The Positioning System

The positioning system 650 may include one or more positioning stages and/or motors which can position the template 108 relative to the platter 648 such that a first gap 658 is formed. In which the first gap 658 is bounded by at least: the recessed surface 238; the mesa sidewalls 240; and the platter 648. The platter 648 is configured to form the first gap while also protecting the patterning surface coating 242. The positioning system 650 may include a template chuck 118 and a platter chuck. The platter chuck is substantially similar to the substrate chuck 104. The positioning system 650 may share components with the nanoimprint system 100.

Protective Layer

Figure 6C:
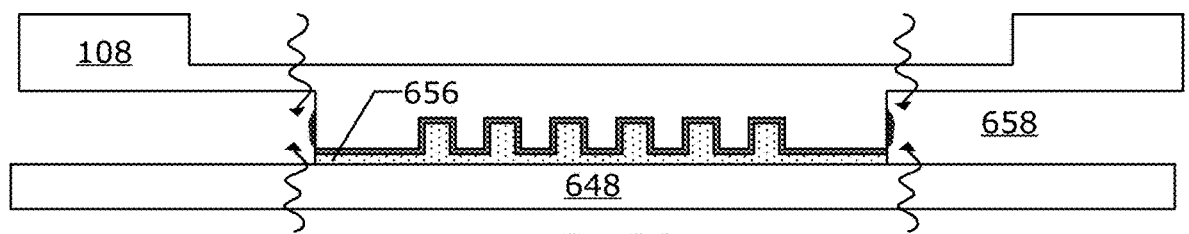

FIG. 6C is an illustration of a platter 648 that includes a protective layer 656. As illustrated in FIG. 6C the positioning system has brought the patterning surface coating 242 into contact with the protective layer 656 and formed the first gap 658. The first gap 658 is bounded by the platter 648, the mesa sidewall 240, and the recessed surface 238. In an alternative embodiment, the protective layer 656 extends across a surface of the platter 648 that includes more than just the area in which the patterning surface coating 242 contacts the platter 648 and extends into the first gap 658. In an embodiment, the protective layer 656 is a formable material that is applied to the platter as droplets which are merged to form a liquid protective film (layer) between the platter 648 and the template 108. In an alternative embodiment, the protective layer stays in a liquid state during the cleaning process. In an alternative embodiment, the protective layer is partially or fully cured prior to the mesa sidewall being cleaned by via one or more of: actinic radiation; heat; and pressure.

In an embodiment, the fluid dispenser 122 is used dispense a protective layer 656 onto the platter 648 as droplets which are spread as a temporary layer between patterning surface 112 and the platter 648. The mesa sidewall 240 may only be exposed to the reactive gas after the protective layer 656 covers the patterning surface 112.

The Ionizing Radiation Source

The ionizing radiation source 654 is configured to supply ionizing radiation in the region of the mesa sidewalls 240 while the platter 648 protects the patterning surface coating 242. The ionizing radiation source 654 may include one or more of: LEDs, lasers, lamps; mercury lamps, halogen lamps, hollow cathode lamps, lenses, mirrors, apertures; etc. which guides the light towards the mesa sidewalls 240. The light from the ionizing radiation source 654 may pass through one or both of the template 108 and the platter 648. The ionizing radiation source 654 may also include components which prevent light from the ionizing radiation source 654 from reaching the patterning surface coating 242. The ionizing radiation may have a wavelength of 172 nm, 193 nm, 222 nm, and/or 248 nm.

In an embodiment, the ionizing radiation source 654 is positioned above the template 108 and ionizing radiation passes through the template 108 to generate radicals near the mesa wall 240 by photolysis (photodissociation). Photolysis causes disassociation of molecular species (e.g. oxygen at ionizing radiation wavelength of less than 242 nm, water vapor at ionizing radiation wavelength of less than 190 nm) to form active species (ozone, atomic oxygen radical, hydroxyl radical). Photolysis can also cause the disassociation of an active species (e.g. ozone at ionizing radiation wavelength of less than 310 nm) to create species with higher oxidative potential such as atomic oxygen radicals and hydroxyl radicals. In an alternative embodiment, IR, or visible light is used for multiphoton photolysis. In an embodiment, the wavelength of the ionizing radiation has a sufficient energy level (7.2 eV, 172 nm) to cause the scission of bonds, such as C—C, C—H, C—O, C=C, C—N.

In an alternative embodiment, the ionizing radiation source 645 is positioned below the platter 648 and the ionizing radiation passes through the platter to generate radicals (reactive gas) near the mesa sidewall 240 by photolysis. These radicals are capable of decomposing organic polymerizable material. In an alternative embodiment, the reactive gas is ozone which is formed from oxygen that is naturally found in the first gap. In an alternative embodiment, the ionizing radiation generates radicals with reactivity that is greater than ozone for enhanced decomposition of the extrusions 644 on the mesa sidewalls 240.

In an embodiment, the ionizing radiation source includes an excimer laser such as KrF laser which produce 248 nm light or a KrCl laser which produces ionizing radiation at 222 nm. One or more of windows and apertures may be used to guide the light to the mesa sidewalls 240 while also blocking or attenuating energy from the patterning surface 112 can be used to prevent polymerization of the formable material 124.

The ionizing radiation source 654 may include one or more of a laser, LED, lamp, etc. which provides radiation in a UV band and/or VUV band. The exposure time and exposed area for the ionizing radiation may be controlled by shutters and apertures. For example, a light blocking (or reflective) mask can be applied to prevent transmission of light to the patterning surface coating 242.

The Gas Source

The gas source 652 may include one or more gas supply components such as: mass flow controller, regulators, valves; hoses, ports; couplers; gas cylinders; etc. which are configured to supply one or more gases to at least the first gap 658. The gas supplied with the gas source 652 to the first gap 658 may include oxygen, ozone and/or water vapor, which the ionizing radiation turns into oxygen radicals and hydroxyl radicals using ionizing radiation less than 310 nm to disassociate ozone so as to generate oxygen radicals that react with the water molecules to generate the hydroxyl radicals and/or by disassociating oxygen or water molecules using ionizing radiation less than 240 nm and 190 nm, respectively. In an embodiment, the gas stream may be supplied with the gas source 652 includes a carrier gas (e.g. hydrogen, oxygen, nitrogen, argon, helium, etc.), the carrier gas is a gas which does not become a reactive gas during the cleaning process. In an alternative embodiment, the gas source 652 is a liquid well which provides gas vapor through evaporation.

In an embodiment, the ratio of carrier gas to reactive gas is up to 20% by weight reactive gas such as ozone or 300 g/m$^3$. The amount of gas flowing through the gas ports (which are also referred to as ports in this disclosure) may be on the order of 1-5,000 standard cubic centimeters per minute (sccm) at each side of template. In an embodiment, the gas source 652 may include a heater or cooler to control the temperature of the gas as it flows into the first gap 658.

Cleaning Reaction

The hydroxyl radical reaction rate constants for organic compounds such as alkanes or alkenes which make up the extrusions can be several orders of magnitude higher when compared to ozone. The lifetime of the radicals is short. An embodiment may include exposing oxygen to radiation or an electrical discharge so as to create atomic oxygen radical and ozone within a few centimeters of the mesa sidewalls 240. In an embodiment, a carrier gas helps to carry away the products of the cleaning process. In an embodiment, ozone may be converted back to oxygen by a catalytic or thermal destruct unit.

In an embodiment, the ionizing radiation may be used to initiate a photolysis reaction that generates a reactive gas from a non-reactive precursor gas in the first gaps. Wherein, the reactive gas is a species capable of abstracting hydrogen or causing scission of carbon-carbon bonds in the extruded material composition. Examples of non-reactive precursor gases are: air; oxygen; nitrogen dioxide; carbon dioxide; water vapor; some nitrogen containing molecules; some oxygen containing molecules; etc. Other chemical reaction pathways may also be used to generate a reactive gas.

In an embodiment, ozone in the first gap 658 is exposed to ionizing radiation from KrF laser (248 nm wavelength), which causes ozone to disassociate into an oxygen molecule and an oxygen radical. In which case, the ozone takes on the role of a precursor gas to the reactive gas. In an embodiment, the first gap 658 includes both ozone and water vapor, in which case, the oxygen radical may then generate two hydroxyl radicals from a reaction of the oxygen radical with a water molecule in the water vapor. The oxygen radical, hydroxyl radical, and ozone all take part in decomposition of the extrusion 644.

In an embodiment, oxygen gas is removed from one or both of the optical pathway between first gap and the ionizing radiation source. Oxygen gas may be removed by flowing nitrogen gas into the optical pathway between first gap and the ionizing radiation source. The ionizing radiation source 654 may have a wavelength of 193 nm or alternatively has a wavelengths below 240 nm.

In an embodiment, reactive species are generated in the first gap 658. The reactive species is capable of cleaving organic bonds and decomposing organic materials. The reactive species are used to clean the mesa sidewalls 240. By generating the reactive species at the mesa sidewalls we can control what is and what is not impacted by the reactive gas. Highly reactive radicals, such as hydroxyl tend to have short lifetimes, the applicant has found that it is useful to create the radicals near the point of application, this has dual advantage of localizing the effect, and having a higher reaction rate.

Gas Flowing Through the Template

Figure 6D:
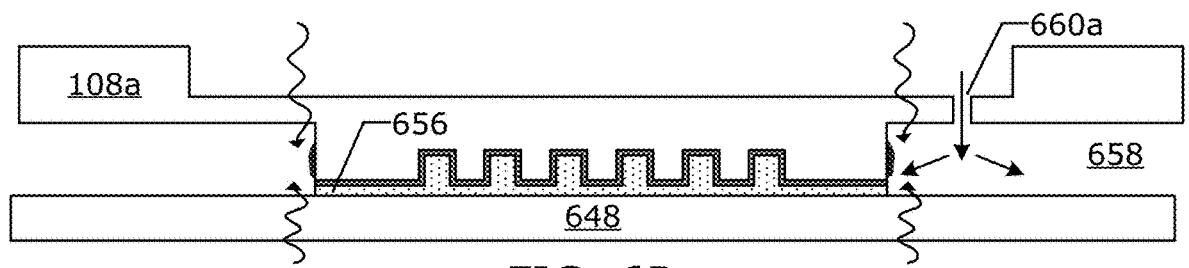

In an embodiment, gas from the gas source 652 may be delivered through one or more gas ports 660a in the template 108a into the first gap 658 as illustrated in FIG. 6D. In an embodiment, the one or more gas ports 660a are positioned close to the mesa sidewall.

Gas Flowing Though the Platter

Figure 6E:
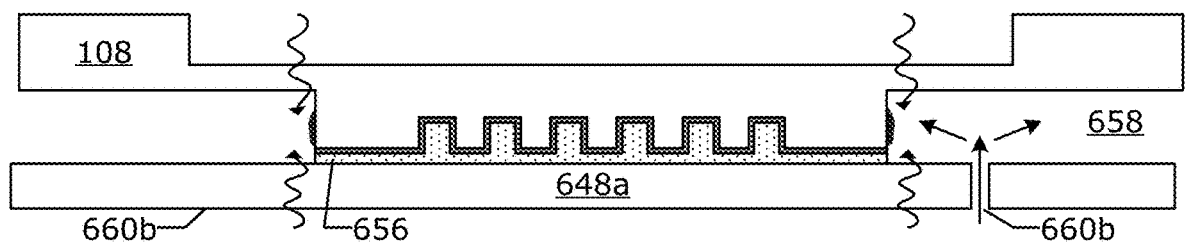

In an alternative embodiment, gas from the gas source 652 is delivered through one or more gas ports 660b in the platter 648a into the first gap 658 as illustrated in FIG. 6E.

Gas Flowing Via Side Gas Ports

Figure 6F:
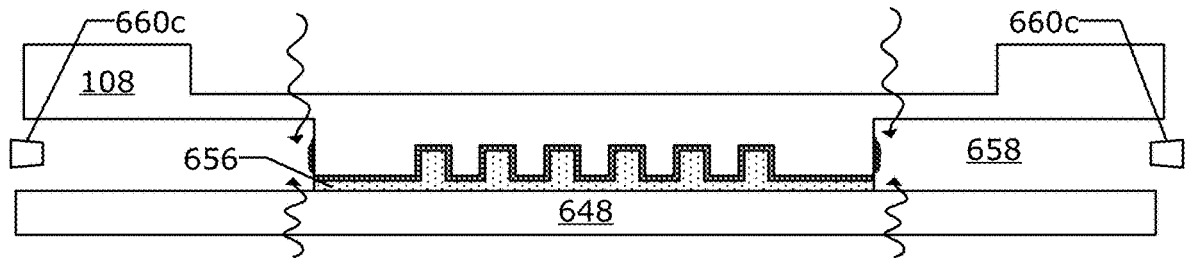

In an alternative embodiment, gas from the gas source 652 is delivered through one or more gas ports 660c into the first gap 658 as illustrated in FIG. 6F.

Gas in the First Gap

An embodiment, may include a combination of one or more gas ports 660a-d, which provide one or more of: reactive gases; non-reactive gases; carrier gases; protective gases; and vacuum pressure.

In an embodiment, the introduction of reactive or non-reactive gas through the gas ports may occur after the mesa 110 is in contact with the protective layer 646. The first gap 658 or a portion of the first gap may be exposed to ionizing radiation to generate the reactive gas through one or more of the gas ports 660a-d.

Gas and/or decomposition species may be captured by applying vacuum to one or more gas ports 660a-c. The vacuum may be applied while gas is being flowed into the first gap 658 and/or after the first gap 658 is no longer exposed to ionizing radiation.

In an embodiment, reactive gas species are generated in the first gap 658 only while the patterning surface coating 242 is protected by for example, a protective layer 656 or other techniques. In an alternative embodiment, a reactive gas species is chosen so that it has a relatively long lifetime (seconds to minutes) and is generated upstream from the first gap 658 and is flown into first gap 658 via gas ports 660a-c. In an embodiment, the gas flowing through the one or more of the gas ports may be 1-5,000 sccm at each side of template.

In an embodiment a first gas mixture is introduced through the platter, template body, or nozzles located at the outer edge of the first gap 658. The first gas mixture may include a reactive gas or molecules that are converted to a reactive gas in the first gap 658. In an embodiment, the flow of first gas mixture also carries products of decomposition away from the mesa sidewalls to prevent adsorption and contamination of the freshly cleaned mesa sidewalls. As noted above vacuum or negative pressure may be used to recover gas and byproducts through holes or ports located in the platter and/or template, and/or nozzles at the edge of the first gap 658. In an embodiment, the platter and or the first gas mixture may be heated to raise the temperate inside the first gap 658 to increase reaction rates of the reactive gas species to the extrusions 644. In an embodiment, a cooling gas may be blown against the template via one or more of the gas ports.

The reactive gas and/or decomposition species may be removed from the first gap 658 by applying vacuum to one or more of: gas ports 660*a* in the template 108; gas ports 660*b* in the platter 648*a*; and/or side gas ports 660*c*. In an embodiment, the reactive gas breaks down, prevents polymerization, and/or oxidizes formable material vapor in the first gap 658 and/or on the mesa sidewalls 240.

The template 108 and the platter 648 are arranged to create a first gap 658 that acts as a cleaning chamber. The cleaning chamber is bounded by recessed surface 238, mesa sidewalls 240, and the platter 648. In an embodiment, the sides of the cleaning chamber may be open. The role of the first gap 658 (cleaning chamber) is to facilitate delivery, containment, and evacuation of the reactive gas inside the first gap 658.

In an embodiment, the space between the template 108 and the platter 648 prior to the first gap 658 being formed may be backfilled with a carrier gas which will not become a reactive gas when exposed to ionizing radiation. In an embodiment, the first gap 658 is filled with the carrier gas which will not become a reactive gas when exposed to ionizing radiation, and the non-reactive gas is then flowed into the first gap 658 which become a reactive gas when exposed to the ionizing radiation.

Platter with a Mesa

Figure 6G:
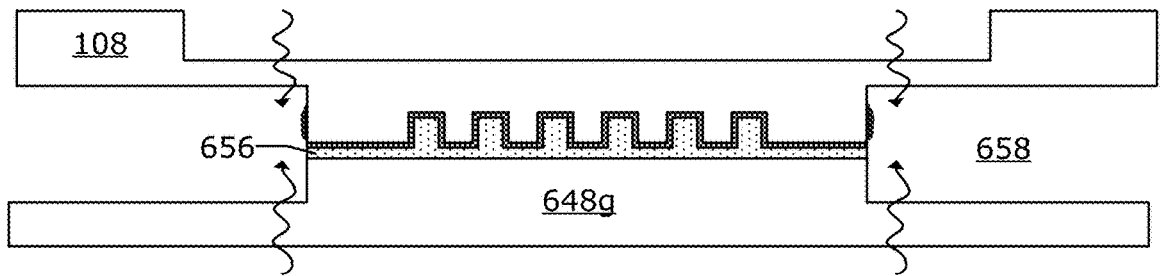

In an embodiment, the platter 648*g* may be comprised of two or more levels on the surface facing the first gap 658 as illustrated in FIG. 6G to form mesas, grooves, channels, and the like, which have been machined, molded, cast, etched, deposited, or laminated, to create a 3-D topography on the surface of the platter which controls the flow of gas during mesa cleaning. The platter 648*g* may include a raised area that is dimensionally matched to the mesa 110 of the template 108. In an embodiment, the raised area of the platter has a coating 656 between the patterning surface 112 and the raised area of the platter. This can provide better protection of the patterning surface coating 242 and isolation of the mesa sidewalls 240.

In an alternative embodiment, the platter mesa has a shape that matches the shape of the template mesa. For example, if the template mesa has a jigsaw shape, then platter mesa may also have a jigsaw shape. The platter mesa can be fabricated to have a dimensional difference of ±40 µm relative to the template mesa. We may do this for a couple of reasons. In an embodiment, the platter mesa may be undersized (1-100 µm) to expose the fluid control region of the mesa to cleaning and coating. In an embodiment, the platter mesa may be oversized (1-5000 µm) to optimize the masking ability to prevent reactive species or coating material from entering the second gap.

Patterning Surface Protective Gap

Figure 6H:
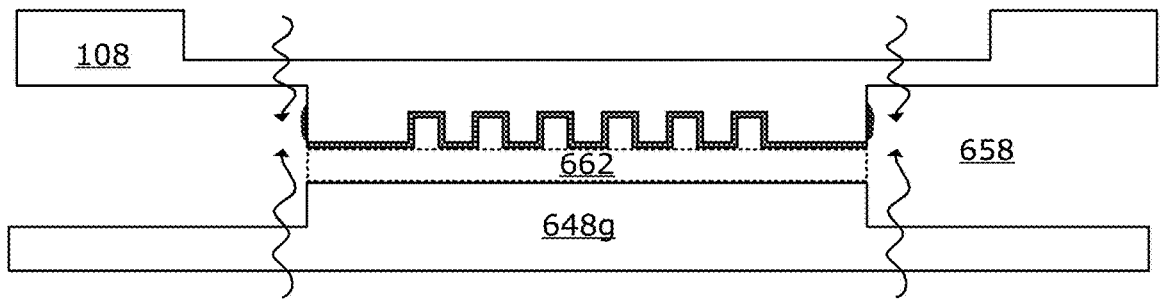
Figure 6I:
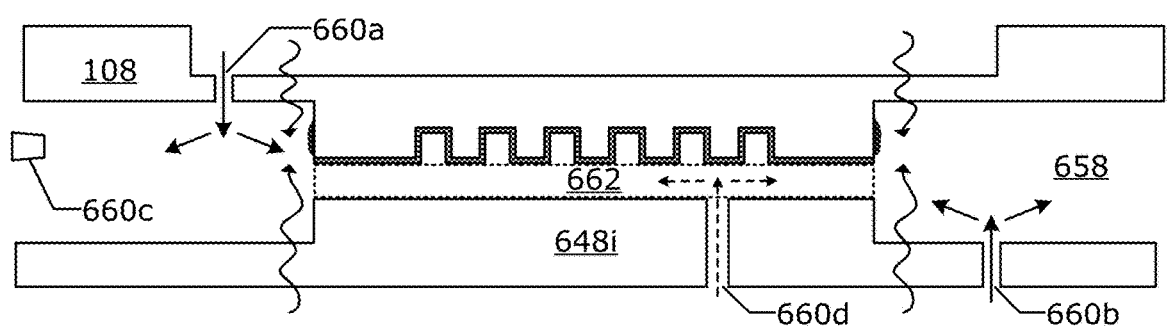

In an embodiment, a raised area of the platter 648*g* is positioned close to but not touching the patterning surface coating 242 forming a second gap 662 as illustrated in FIG. 6H. The second gap 662 is configured to be narrow enough to restrict the flow of gas from the first gap 658 into the second gap 662 and protect patterning surface coating 242 from any reactive gas that is temporarily formed in the first gap 658. The applicant has found that when the second gap 662 has a height that is 5 µm or less the patterning surface coating 242 can be protected from a reactive gas in the first gap 658. The applicant has found that gas flow can be substantially restricted to certain areas, such as the patterning surface 112 of the template 108, by decreasing the second gap 662 between the platter 648 and the mesa 110 which increases the resistance to flow of gas into the second gap 662. In an embodiment, the platter mesa may be nearly equal to the template mesa height.

For example the platter 648 may be made to have a platter mesa that stands 200 µm tall and has approximately the same lateral dimensions as the template mesa. An embodiment may be a mesa sidewall cleaning apparatus that is configured to bring the platter mesa into close proximity, for example 5 µm distance from the template mesa so as to form a restricted gas pathway (second gap 662). The mesa sidewall cleaning apparatus may be configured to clean mesa sidewalls with a specified height (i.e. 30 µm). The mesa platter may be configured to have a height of 200 µm. In which case, the first gap 658 may have a height of 235 µm between the platter recessed surface and the template recessed surface 238.

Supplying Gas to the Protective Gap

In an embodiment, the raised area of the platter 648*i* includes one or more gas ports 660*d* which are supplied with a protective gas from the gas source. The protective gas is a gas that does not substantially react with patterning surface coating 242. In an embodiment, the protective gas does not disassociate when exposed to light from the ionizing radiation source 654. In an alternative embodiment, the protective gas while it is in the second gap is protected from light from the ionizing radiation source 654 by one or more of: the platter 648*i*; the template 108; light blocking material between the ionizing radiation sources 654 and the second gap 662.

Figure 6J:
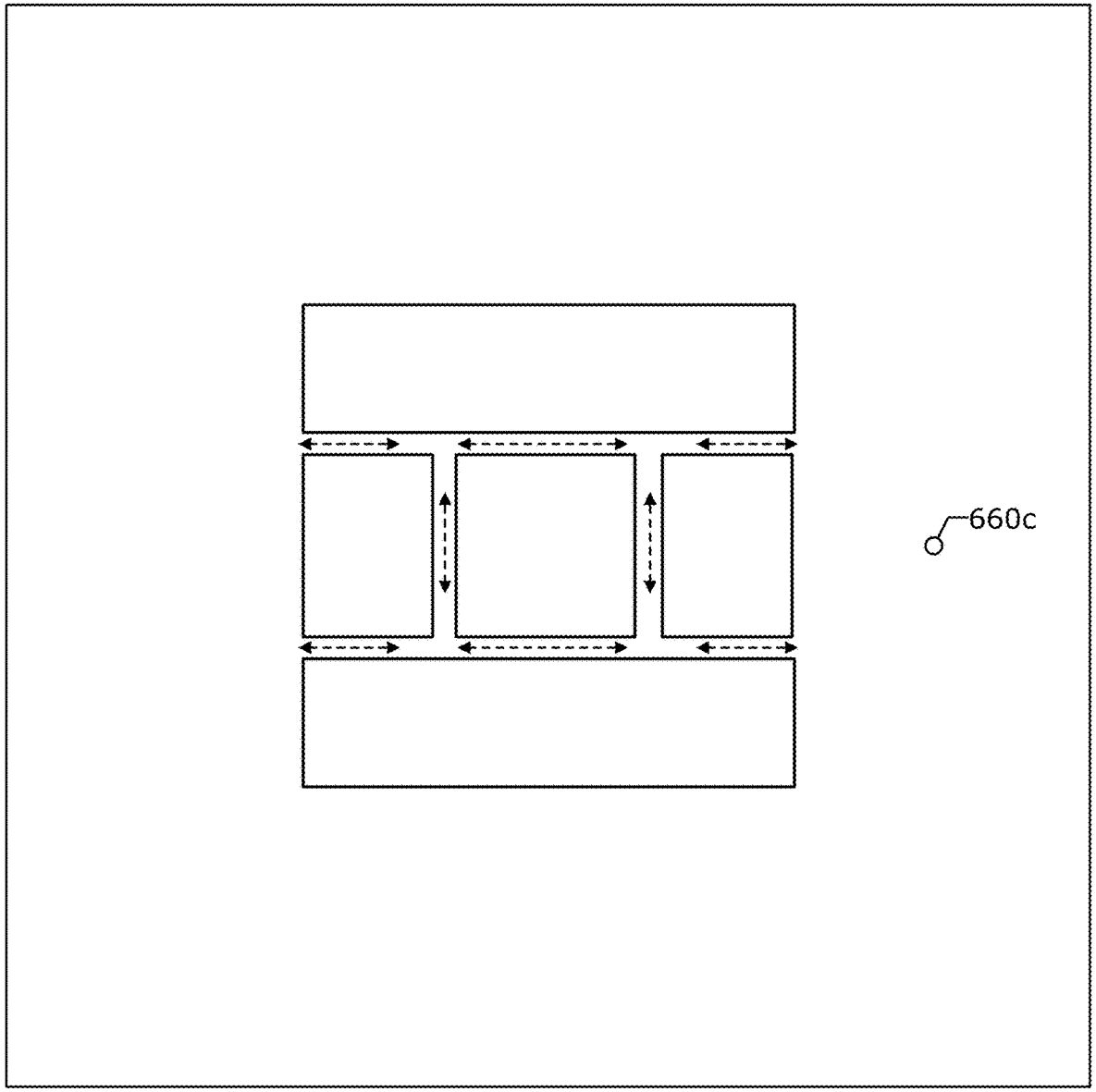
Figure 6J:
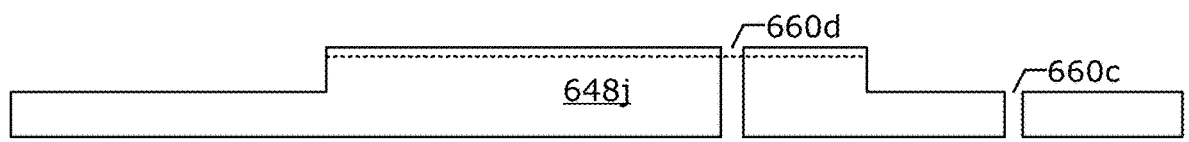

In an embodiment, the raised portion of the platter 648*j* may include channels to facilitate flow along the mesa sidewall 240 where extrusions 644 form as illustrated in FIG. 6J. The gas ports may be circular, rectangular, frame like etc. In FIG. 6J only one circular gas port is illustrated for clarity of illustration. A typical platter may include multiple gas ports that are arranged in a symmetric manner around the mesa. In an alternative embodiment, the platter may include a single gas port that surrounds the mesa in a symmetric manner.

Gas Sensor

In an embodiment, the platter may contain a sensor to detect the concentration of a molecular gas species inside one or both of the first gap 658 and the second gap 662. The gas source may supply a plasma or a gas that becomes a plasma in the first gap but not in the second gap. In an embodiment, the platter may act as a heat source or a heat sink that is heated or cooled to improve the rate at which extrusions are decomposed or removes heat produced by the ionizing radiation.

Positioning System

The positioning system 650 may be configured to achieve parallelism between the patterning surface coating 242 and the platter 648. In an embodiment, the platter positioning stage is at least capable of x-y and theta movement. In an embodiment, the platter positioning stage may include a z-axis movement stage. The template chuck 118 may be configured to adjust the back pressure to maintain template flatness during and/or prior to the mesa sidewall cleaning process. In an embodiment, the template flatness may be measured during and/or prior to the mesa sidewall cleaning process. In an embodiment, the positioning system 650 may include sensors, logic elements, controllers, motors, and/or actuators that are used detect and adjust the relative positions of the platter and the template. A laser sensor may be used to map the surface of the template 108.

The platter and/or the platter chuck may include fiducial marks which are used by the positioning system 650 to align the raised portion of the platter with the mesa of the template. The fiducial marks may be etched or deposited on top of the platter and/or platter chuck. In an embodiment, the positioning system 650 has a positioning accuracy of 0.5 μm-0.1 μm.

Electrostatic Particle Protection

An embodiment, may include an electrostatic particle gathering system which can be used to remove particles from one or both of the platter 648 and the template 108 and to maintain cleanliness before, during and/or between mesa sidewall cleanings.

Structured Platter

Figure 6K:
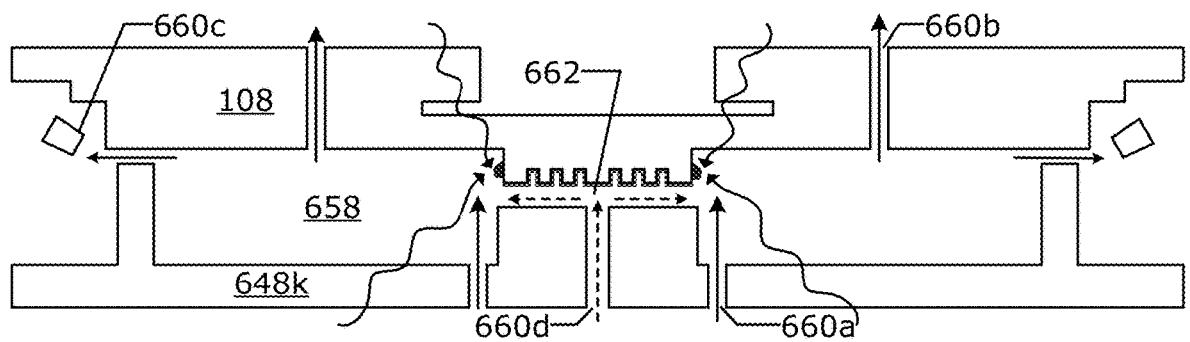

FIG. 6K is an illustration of a structured platter 648k that may be used in an embodiment that includes barriers that create restrictive flow paths at the edge of the structured platter providing resistance to the flow of gas outside of the first gap 658 when the template is brought into close contact with the template 108. The positioning system may be configured to align the template and the platter with each other so as to minimize the flow out of the first gap 658. Gas ports 660c outside of the platter 648k may be configured to blow gas in the region of a path between the platter and the template, thus providing an air current. In an alternative embodiment, the gas ports 660c may be configured to suck the gas out of the first gap 658 in a controlled manner. Gas may be supplied to or from the first gap 658 via gas ports 660a-c. The embodiment, illustrated in FIG. 6K includes a second gap 662 with a protective gas supplied via gas port 660d. An alternative embodiment may include a protective layer 656 instead of the second gap 662.

Figure 6L:
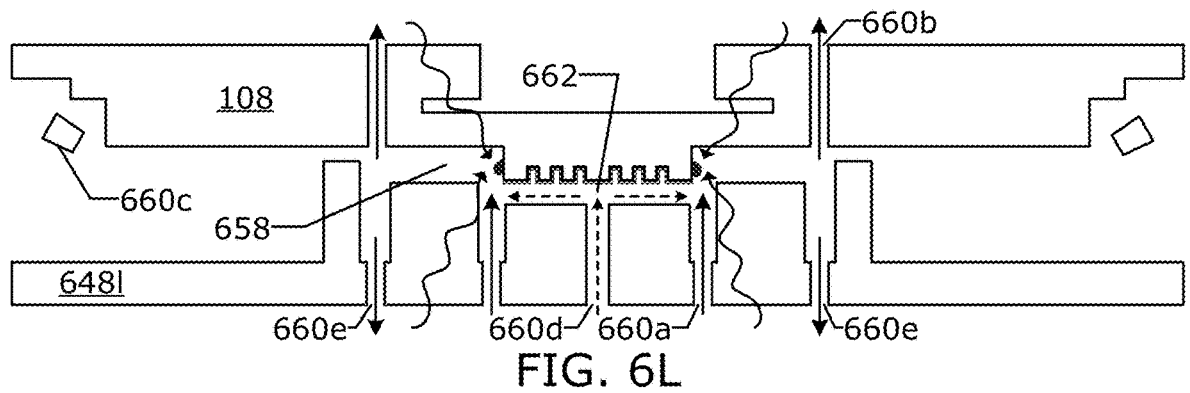

FIG. 6L is an illustration of another structured platter 648l that may be used in an embodiment. The structured platter 648l may include channels, barriers, and/or cavities formed on the platters recessed surface to provide conduits and areas where gas may flow in a controlled manner towards the mesa sidewalls and control the flow of reactant products away from the mesa sidewalls. The structured platter 648l may include one or more gas ports such as gas ports 660a, 660b, 660c, and 660e illustrated in FIG. 6L which are positioned to control the flow gas in and out of the first gap 658. The gas ports may be one or both of the platter 648l and the template 108. The embodiment, illustrated in FIG. 6L includes a second gap 662 with a protective gas supplied via gas port 660d. An alternative embodiment may include a protective layer 656 instead of the second gap 662.

In an embodiment, the platter may be designed to form a non-contact restrictive "gasket" to help retain reactive gases inside the first gap 658. In the same manner as the second gap 662 protects the pattern surface, the platter may also include a third gap towards the outer edge of the first gap which restricts the flow of gas out of the first gap. In accordance with Poiseuille's Law the resistance to flow between stationary parallel plates is inversely proportional to the cubic distance between them. In an embodiment, the ratio between the height of the third gap and the height of the first gap may be on the order 1:100. In which case, the ratio of the resistance to gas flow in the third gap relative to the first gap may be 1:1,000,000. In an embodiment, the depth of a channel is used to control flow of gas in out of certain regions.

In an embodiment, the platter is configured to form gaps and openings which passively guide the first gas mixture to the mesa sidewall and then carries the products of decomposition away from the mesa sidewalls. The one or more gas ports 660 may also be configured to a push first gas mixture towards the mesa sidewalls. The one or more gas ports 660 may also be configured (via vacuum) to pull the products of decomposition away from the mesa sidewalls. Using vacuum to control the flow of the decomposition products allows the decomposition products to be removed, filtered, destroyed, etc. instead of being released inside the mesa sidewall cleaning apparatus. The platter may include topography that improves the containment of gas in the first gap 658. Containment of the gas reduces the escape of gas into other process modules. The added topography can provide restricted barriers to the flow of gas outside of the first gap 658. The added topography can also guide the gas to dedicated gas outlets such as vacuum gas ports. The platter may be fabricated with relative topography on the scale of 10-5,000 μm that passively controls the flow and/or containment of gas within the first gap 658.

Figure 6M:
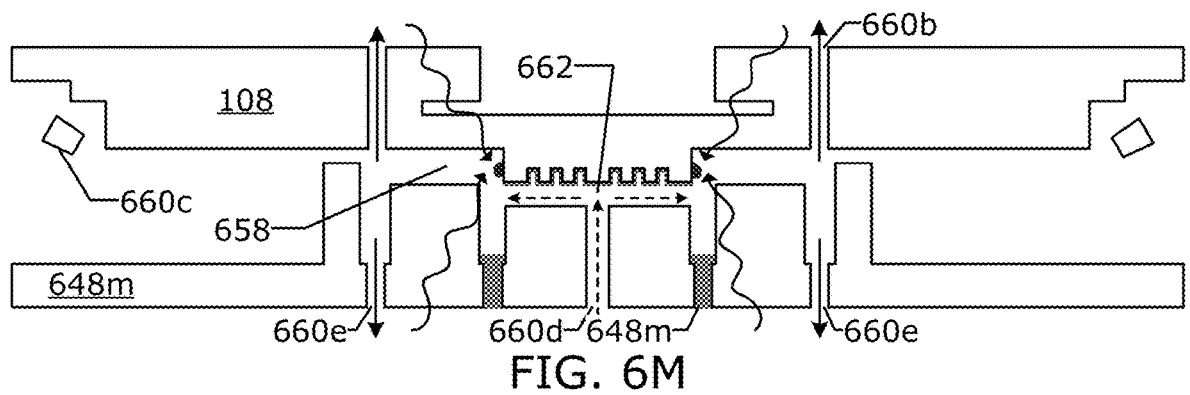

FIG. 6M is an illustration of another structured platter 648m that may be used in an embodiment that is substantially similar to the embodiment illustrated in FIG. 6L, except that the gas source 648 is incorporated into the platter 648 as wells 648m filled with a material that is configured to produce a gas under a first set of process conditions. The first set of process conditions include but are not limited to temperature, pressure, and radiation. In one embodiment, the well 648m may include a heater which causes precursor material (i.e. liquid) in the well to produces a gas which is used to modify (i.e. clean) the mesa sidewall 240. In one embodiment, the pressure in the first gap 648m above the wells is reduced by applying a vacuum to one or more gas ports 660b and 660e that are connected to the first gap 658, thus increasing evaporation. In an embodiment, material in the wells 648m may be exposed to radiation which causes the material to produce a vapor.

A protective gas may be flown into the second gap 662 before, during and/or after vapor is produced in the first gap 658. The protective gas will protect the patterning surface 112 of the template. An alternative embodiment may include a protective layer 656 instead of the second gap 662.

Mesa Sidewall Coating

Figure 7A:
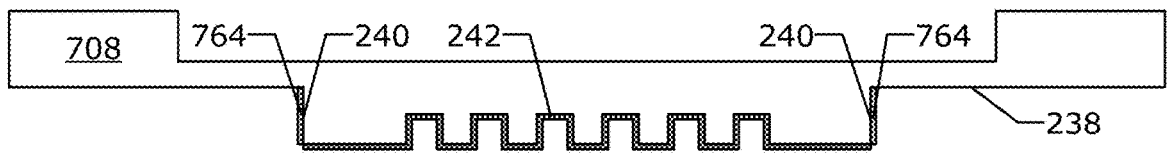
FIGS. 7A-7H are illustrations of embodiments which are used to coat mesa sidewalls in embodiments.

As noted above the removing extrusions from the mesa sidewalls reduces defects. What is also helpful, is preventing extrusions from forming on the mesa sidewalls in the first place. The applicant has found that when a template 708 has a nonwetting mesa sidewall coating 764 on the mesa sidewall 240 as illustrated in FIG. 7A, the nonwetting mesa sidewall coating 764 reduces the rate at which extrusions attach themselves to the mesa sidewall 240. In the context of the present disclosure, a nonwetting mesa sidewall coating is a coating that reduces the ability of formable material 124 and/or components of the formable material to wet the mesa sidewall relative to the uncoated mesa sidewalls. The nonwetting mesa sidewall coating may have a surface energy which is less than the surface energy the template material. The nonwetting mesa sidewall coating 764 may be used in addition to or a replacement of the mesa sidewall cleaning process and systems. The nonwetting mesa sidewall coating 764 inhibits the propagation of extrusions and accumulation of formable material vapor on the mesa sidewall 240. The applicant has found that applying a coating to just the mesa sidewall while not coating the patterning surface is a challenge using traditional masking techniques. The applicant has found that using traditional techniques to coat mesa sidewalls on the scale used in imprint lithography can have can have offset errors, coating thickness variations at the sides and corners can affect the fabrication process. What is needed is a better system and/or processes for producing a template with a coating on the mesa sidewall in which the patterning surface of the template is protected or not coated.

Figure 7B:
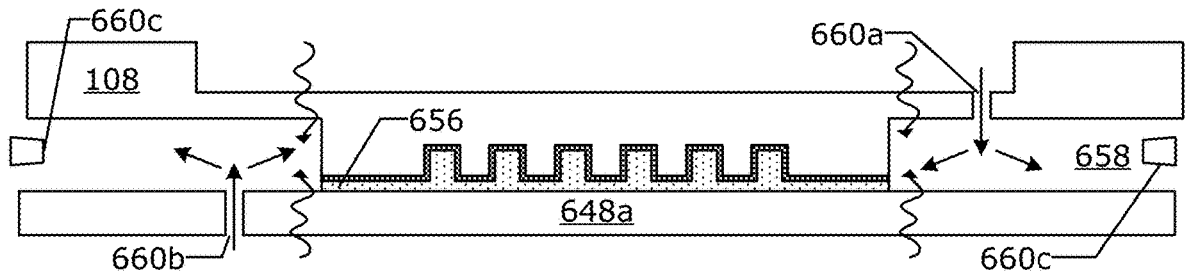

The mesa sidewall coating system is substantially similar to the mesa sidewall cleaning systems described above. For example, as illustrated in FIG. 7B the mesa sidewall coating system may make use of a protective layer 656 that is applied to one or more of: the patterning surface 112; the patterning surface coating 242; and the platter 648a in substantially the same manner as the mesa sidewall coating system. A platter positioning system then brings the platter 648a template into close proximity with each other, with the protective layer 656 connecting the patterning surface 112 and the platter 648a while also forming the first gap 658 between the recessed surface 238 of the template and the platter 648a. After the protective layer 656 protects the patterning surface 112, a coating gas mixture from the gas source 652 is then flowed into the first gap 658 via one or more gas ports 660a-c. In an alternative embodiment, the coating gas mixture includes at least one volatile compound or precursor which coats all or a subset of the surfaces of the first gap 658. The subset of the surfaces of the first gap 658 that are coated includes at least the mesa sidewall 240. The mesa sidewall 240 and/or the volatile compound or precursor near the mesa sidewall may be exposed to radiation, humidity, and/or heat which initiate a reaction between the mesa sidewall 240 and volatile compound or precursor. The positioning system then separates the template 108 from the platter 648a.

The coating system illustrated in FIG. 7B allows a mesa sidewall coating 764 to be applied, while the patterning surface 112 is protected by the protective layer 656. In an embodiment, there may be a liquid material (i.e. formable material) between the platter 648a and the patterning surface 112 which may be cured prior to the mesa sidewall 240 being coated. In an embodiment, a partial pressure of formable material vapor in first gap 658 is reduced prior to the mesa sidewall being coated by pulling gas with formable vapor in it from the first gap 658 and then pushing a substitute gas into the first gap 658. This process of applying a mesa sidewall coating 764 may have a side effect of also coating portions of the recessed surface 238 of the template that are in the first gap 658.

A gas containing a low surface energy compound is introduced into the first gap 658 between platter 648 and the template 108 via gas ports in one or more of the template 108, platter 848c, and nozzles surrounding an opening in the first gap 658. In an embodiment, a low surface energy material coats the mesa sidewall 240. The low surface energy compound may adhere to the mesa sidewalls by intermolecular forces or bond with hydroxyl groups on the mesa sidewalls 240.

In an embodiment, a mesa sidewall cleaning process is performed prior to performing the mesa sidewall coating process. In an embodiment, different gas ports may be used for cleaning, coating, and purging. In an embodiment, gas ports, nozzles, and the platter geometry are used to substantially confine the low surface energy compound to the first gap 658 and to control where it travels so as not to contaminate other components in and around the mesa sidewall coating apparatus.

Prior to the positioning system separating the template 108 from the platter 648a a coating gas in the first gap 658 may be purged and/or exhausted.

Figure 7C:
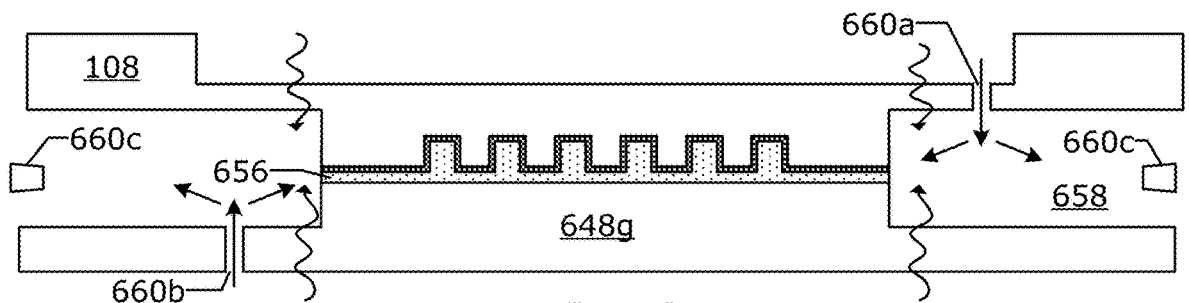
Figure 7D:
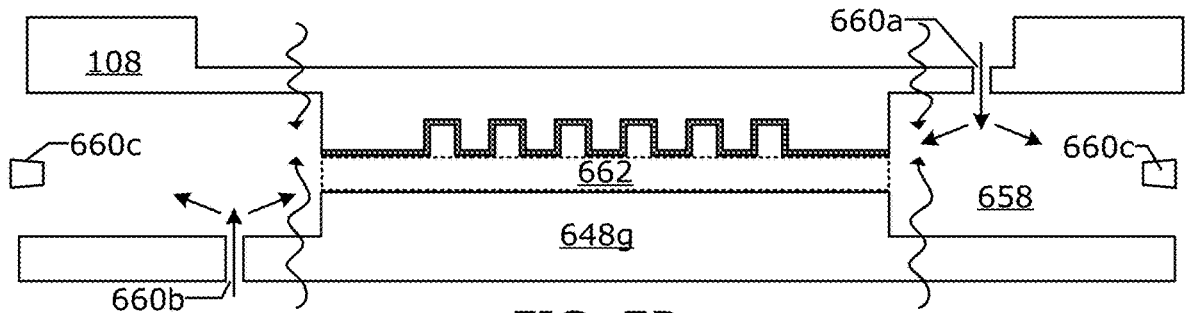
Figure 7E:
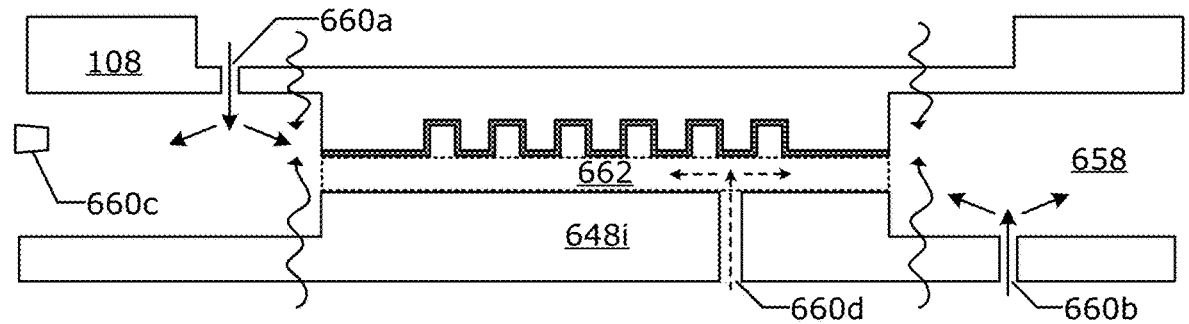
Figure 7F:
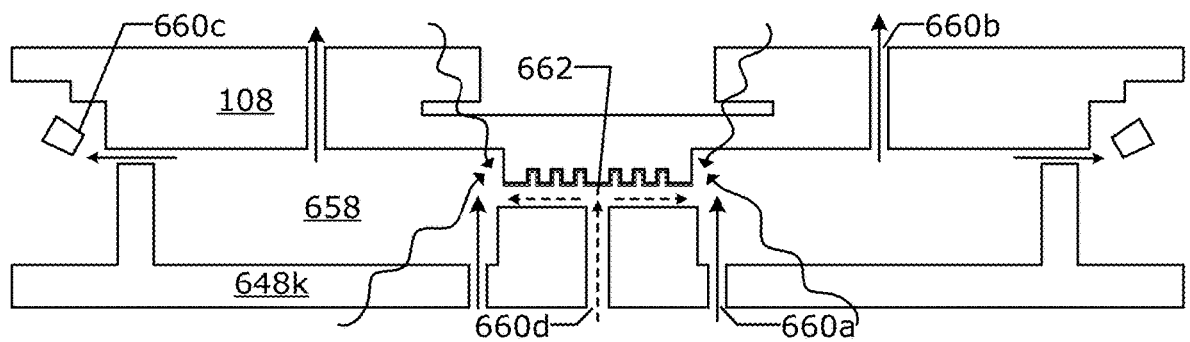
Figure 7G:
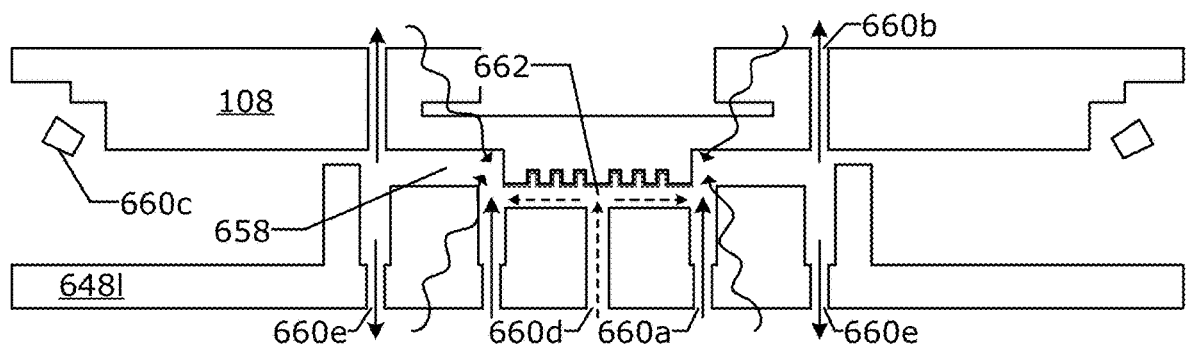
Figure 7H:
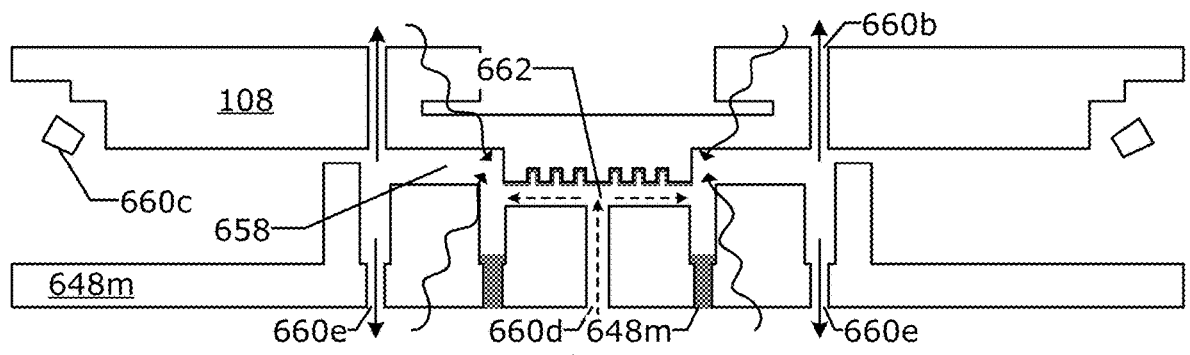

A coating system embodiment may use the platter 640g which may have multiple planes as illustrated in FIG. 7C which is used in a manner that is substantially similar to the system for cleaning the mesa sidewall with a platter that has a mesa, except that a coating gas is provided instead of cleaning gas. In another coating system embodiment a protective layer is not used and a protective second gap 662 is used instead as illustrated in FIG. 7D in a manner that is substantially similar to the system for cleaning the mesa sidewalls, except that the protective second gap protects the patterning surface 112 from the coating gas instead of the cleaning gas. In a coating system embodiment, a protective gas is supplied via the platter to the second gap 662 as illustrated in FIG. 7E in a manner that is substantially similar to the system for cleaning the mesa sidewalls, except that the protective gas protects the patterning surface from the coating gas instead of the cleaning gas. In another coating embodiment, a structured platter 648k is used instead as illustrated in FIG. 7F in a manner that is substantially similar to the system for cleaning the mesa sidewalls except that flow of the coating gas out of the first gap 658 is restricted instead of the cleaning gas. In another coating embodiment, a structured platter 648l is used instead as illustrated in FIG. 7G in a manner that is substantially similar to the system for cleaning the mesa sidewalls except that the structured platter 648l has surfaces for controlling the flow of a coating gas to and from the mesa sidewall. In another coating embodiment, a structured platter 648m is used instead as illustrated in FIG. 7H in a manner that is substantially similar to the system for cleaning the mesa sidewalls except that the structured platter 648m has wells 652m that contains a material that produces coating vapor instead of a cleaning vapor.

In an alternative embodiment, the patterning surface 112 is a subset of the top surface of the mesa 110 and is surrounded by an outer fluid control feature region. In an embodiment, the protective layer 656 covers the patterning surface 112 of the mesa 110 but not the outer fluid control feature region of the template's mesa (this can be accomplished by an embodiment with a platter mesa that is smaller than the template mesa). Then as the mesa sidewall is receiving a nonwetting coating the outer fluid control feature region will also receive a nonwetting coating. In an embodiment, the platter mesa does not cover the outer fluid control feature region of the template's mesa.

Method of Modifying Sidewall of Mesa by Cleaning or Coating

Figure 8A:
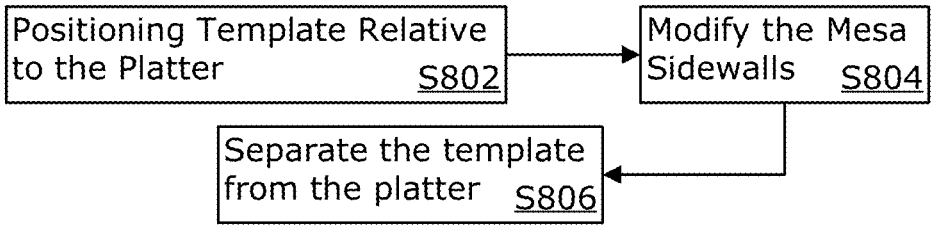
FIGS. 8A-8I are illustrations of methods which are used to in embodiments.

FIG. 8A is an illustration of a method 800 of modifying sidewalls 240 of a mesa 110, while protecting the patterning surface 112 of the template 108. In the context of the present disclosure modifying the sidewall includes cleaning the mesa sidewall and/or coating the mesa sidewall. Cleaning the mesa sidewalls may include removing extrusions that have attached themselves to the mesa sidewalls during an imprinting process. Coating the mesa sidewalls may include exposing the mesa sidewalls to a coating gas while at the same time preventing the coating gas from reaching the patterning surface 112 and/or the patterning surface coating 242.

The method 800 may include a positioning step S802 of positioning the template 108 and the platter 648 into a first position relative to each other at a start of a first period. When the template 108 and the platter 648 are in the first position a first gap is formed. The first gap 658 is bounded by at least: the platter 648, the mesa sidewalls 240, and the recessed surface 238 of the template 108. The first gap 658 may have an outer edge which has an opening through which gas may escape from the first gap 658. The platter 648 may include barriers which restrict the flow of gas out of the first gap 658.

The method 800 may include a modifying step S804 which is performed after the first gap is formed in the positioning step S802. The modifying step S802 may include modifying the mesa sidewalls with a reactive gas in the first gap during the first period. During the first period, the platter is configured to protect the pattern area from the reactive gas while in the first position relative to the template.

The reactive gas may enter the first gap via one or more of: gas ports in the template; gas ports in the platter, gas ports of nozzles outside an outer edge of the first gap; and wells with on the platter. The wells on the platter may include a material that produces a gas via evaporation, and/or chemical reaction. In a first embodiment, the gas which enters the first gap does not modify the mesa sidewall until being exposed to ionizing radiation. In a second embodiment, the gas which modifies the mesa sidewall only enters the first gap when the pattern area of the template is protected.

The method 800 may include a separation step S806 after the first period. During the separation step S806 the template and the platter are positioned in a second position relative to each other. In the second position the platter is not configured to protect the pattern area from any gases that are between the template and the platter.

The modifying step S804 may include using a reactive gas in the first gap 658 to modify the mesa sidewalls 240 by applying a coating to the mesa sidewalls 240. At the same time as applying the coating to the mesa sidewalls 240 the reactive gas does not apply a coating to the pattern area. The coating being applied during the modifying step S804 may be a nonwetting mesa sidewall coating 764.

During the modifying step S804 a reactive gas in the first gap 658 may modify the mesa sidewalls 240 of the template 108 by removing material on the mesa sidewalls 240. At the same time as removing material from the mesa sidewalls 240 the reactive gas does not remove material from the pattern area.

Figure 8B:
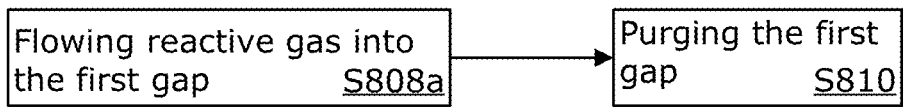

The modifying step S804, includes exposing the mesa sidewalls to a reactive gas. In one optional embodiment as illustrated in FIG. 8B, an optional modifying step S804a includes optional step S808a of flowing the reactive gas into the first gap during the first period. The reactive gas modifies the mesa sidewalls 240 by either coating or cleaning the mesa sidewalls 240. In one optional embodiment, an optional modifying step S804a also includes an optional purging step S810 of purging the reactive gas from the first gap after the first period, by one or both of: flowing a non-reactive purging gas into the first gap, or exhausting the reactive gas from the first gap.

Figure 8C:
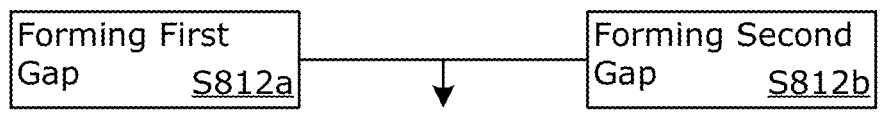

One optional embodiment may include an optional positioning step S802a as illustrated in FIG. 8C. The optional positioning step may include forming a first gap S812a and forming a second gap S812b at the same time. The first gap 658 is bounded by the platter 648, the mesa sidewall 240, and the recessed surface 238. The second gap 662 is bounded by the platter 648 and the mesa 110. The second gap 662 provides resistance to the flow of gas from the first gap 658.

Figure 8D:
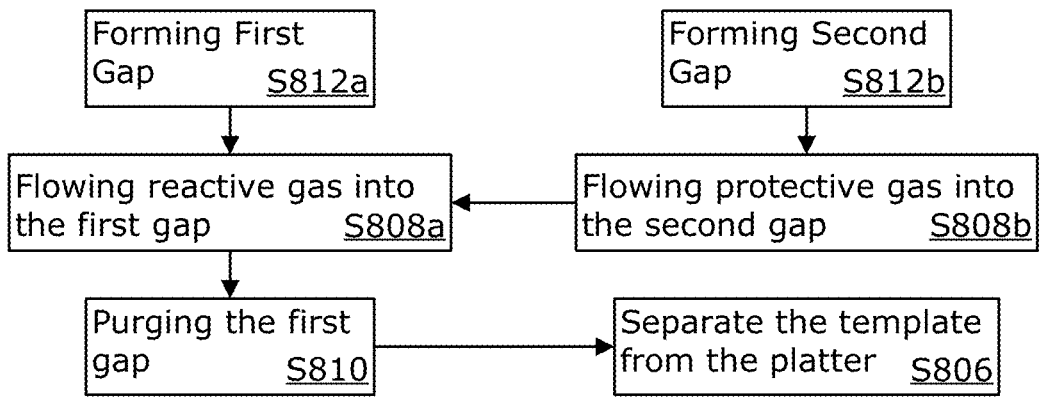

One optional method 800a as illustrated in FIG. 8D may include forming the first gap S812a and forming the second gap S812b between the pattern area and the platter. A protective gas which may be non-reactive may be flown into the second gap S808b. The protective gas may begin flowing prior to the second gap being formed. The reactive gas may then be flown into the first gap in a step S808a after step S808b. The reactive gas may then be purged from the first gap in step S810. After the reactive gas is purged then the template and the platter may be moved to a second position in a separation step S806.

Figure 8E:
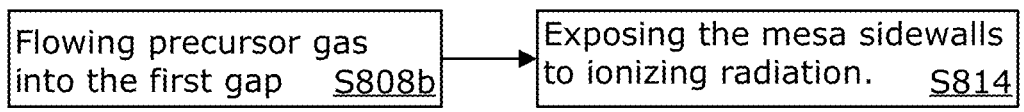

One embodiment may include an alternative flowing step S808a which includes the following substeps of: substep S808b of flowing a precursor gas and then substep S814 of exposing the precursor gas to ionizing radiation. The precursor gas may be initially non-reactive or have relatively low reactivity that becomes reactive after being exposed to ionizing radiation as illustrated in FIG. 8E. The precursor gas may be a mixture that includes oxygen and water vapor. In one embodiment, the reactive gas is formed near the mesa sidewall by exposing precursor gas adjacent to the mesa sidewalls to ionizing radiation in the substep S814. In an embodiment, ionizing radiation reaches the mesa sidewalls through one or more windows in the platter during the first period.

Figure 8F:
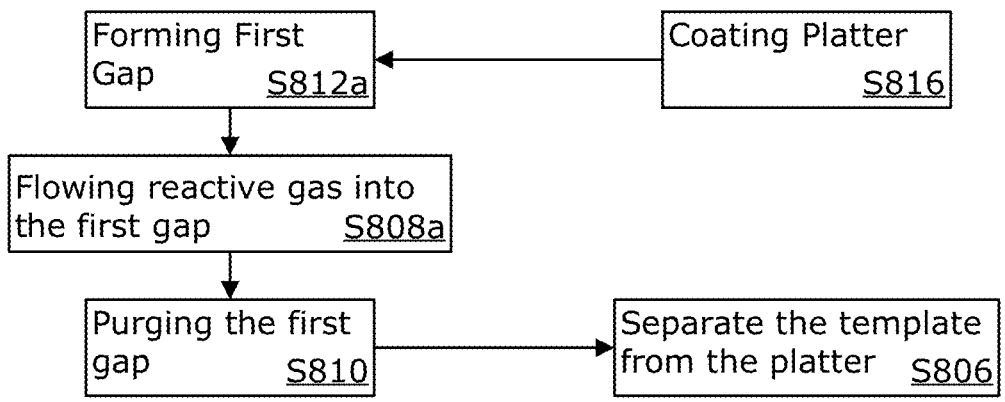

FIG. 8F is an illustration of an alternative method 800b, that includes an optional protective coating step S816 of applying a protective layer 656 to the platter 108. The protective layer 656 may be deposited as a plurality of droplets which forms a protective layer when forming the first gap S812a. In an embodiment, the protective layer may be cured to solidify the protective layer. In an alternative embodiment, the protective layer 656 is formed by one or more of: dip coating; evaporative coating, spin coating, etc. The first gap may be formed in a step S812a by bringing the patterning area into contact with protective layer 656. In an embodiment, the protective layer is cured after the pattern area is brought into contact with the protective layer. In an alternative embodiment, the protective is layer is a soft coating on the platter that does not leave a residue behind on the pattern area. After the patterning area is protected by the protective layer, in a step S810 a reactive gas is brought into contact with the mesa sidewall. After the reactive gas modifies the mesa sidewall the reactive gas is purged from the first gap in a step S810. After the reactive gas is purged, the template is separated from the platter. The protective coating on the platter may be cleaned, recoated, and/or the old coating maybe reused.

Figure 8G:
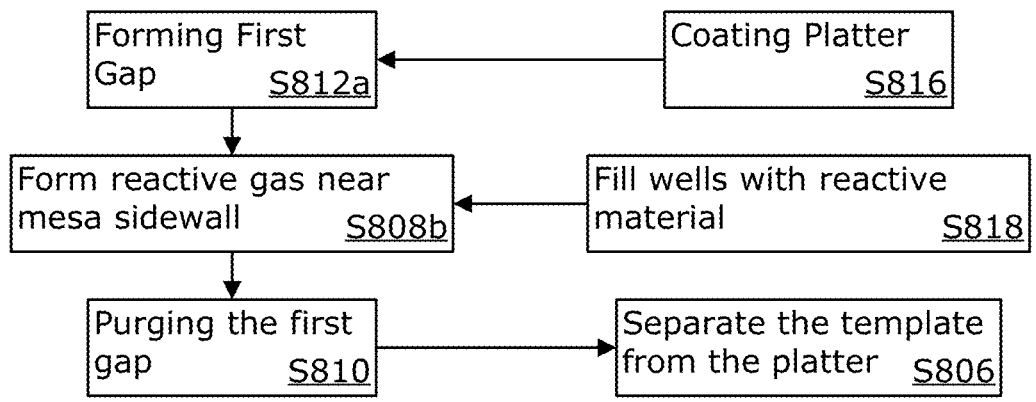

FIG. 8G is an illustration of an alternative method 800c, that is substantially similar to a method 800b. Alternative method 800c may include filling wells of the platter in a step S818 with a material that produces a gas via evaporation and/or chemical reaction. The wells may be filled prior to or after the platter is coated in a step S816. The wells may also be filled prior to or after the first gap is formed in step S818. Energy is supplied to the material in the wells which cause it to produce a vapor that modifies the mesa sidewalls in step S808b by coating or cleaning. The energy may take the form of heat, radiation, or reduced pressure which causes the vapor to be produced.

Figure 8H:
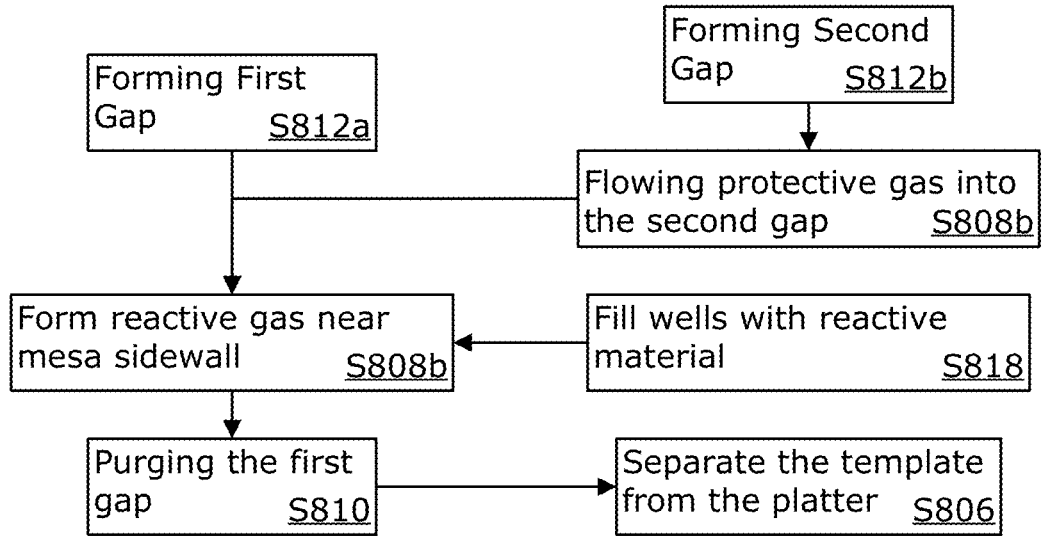

FIG. 8H is an illustration of an alternative method 800d which is substantially similar to a method 800c. Alternative method 800d may include replacing the coating platter step S816 with forming second gap step S808b and flowing the protective gas step S808b. Step S818 may be performed before or after steps S812a, S812b, and S808b.

Figure 8I:
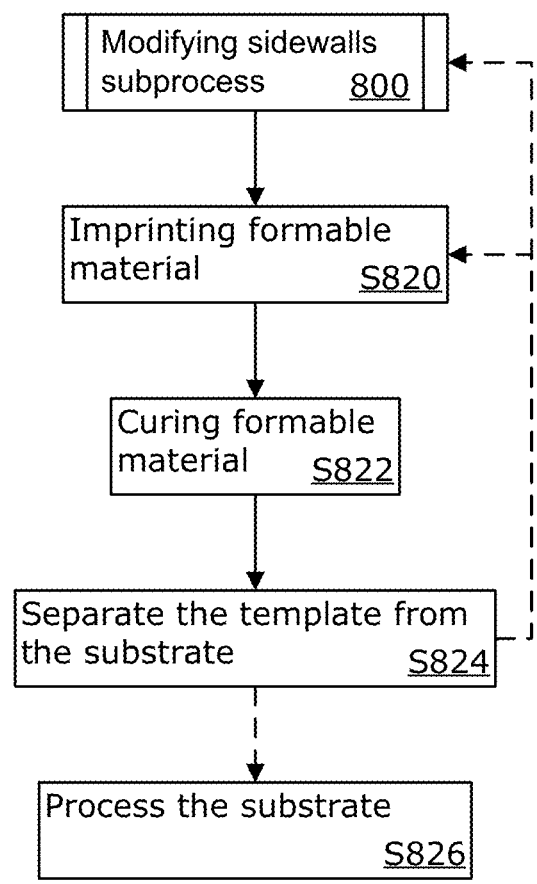

FIG. 8I is an illustration of a manufacturing method 866 which may use a nanoimprint lithography system 100. The manufacturing method 866 includes a subprocess 800 of modifying the mesa sidewalls by one or both of coating or cleaning the mesa sidewalls 240 while protecting the patterning surface 112. Subprocess 800 may include one or more of the steps illustrated in FIGS. 8A-8H. The template 108 is used to imprint formable material 124 on the substrate 102 in an imprinting step S820. In an embodiment, step S820 may be performed after subprocess 800. In a step S822, the formable material 124 is cured while the template 108 is in contact with formable material 124 forming a patterned layer on the substrate 102. In a step S824, the template 108 is separated from the patterned layer on the substrate.

In an embodiment, the template 108 and the substrate 102 are moved relative to each other to a new imprinting field and the manufacturing method 866 returns to step S820. In an embodiment, the mesa sidewalls 240 are modified again in the subprocess 800, for example by cleaning extrusions produced during steps S820 and S822. In an embodiment, the mesa sidewalls are modified after a set number of imprints. In an embodiment, the mesa sidewalls are inspected and modified if the extrusions on the mesa sidewall are above a threshold. In an embodiment, steps S820, S822, and S824 are performed one or more times prior to subprocess 800 being performed for the first time.

In an embodiment, the substrate undergoes further processing in a step S826. The further processing in step S826 may include etching processes to transfer a relief image into the substrate that corresponds to the pattern in the patterned layer. The further processing in step S826 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. An apparatus comprising:
    a template chuck configured to hold a template;
    a platter; and
    a positioning system, during a first period of time, configured to position the template chuck and the platter at a first position relative to each other;
    wherein the template has a pattern area on a first surface of a mesa;
    wherein at least a portion of the platter has a removable coating and the first position is such that the removable coating contacts the pattern area;
    wherein mesa sidewalls surround the first surface of the mesa; and
    wherein the apparatus is configured to expose the mesa sidewalls to a first gas, wherein the first gas is configured to modify the mesa sidewalls during the first period;
    wherein the first position is such that the removable coating provides resistance to flow of the first gas towards the pattern area of the template during the first period.

2. The apparatus according to claim 1, wherein the platter includes wells which includes a precursor material, wherein the precursor material in the well produces the first gas during the first period, wherein the platter is configured to prevent the material in the well from producing the first gas prior to the first period.

3. The apparatus according to claim 1, wherein the positioning system is further configured to form a first gap bounded by at least the sidewalls of the template, a recessed surface of the template, and the platter, wherein the platter includes one or more wells for storing a material which produces the first gas in the first gap.

4. An apparatus comprising:
    a template chuck configured to hold a template;
    a platter;
    a positioning system, during a first period of time, configured to position the template chuck and the platter at a first position relative to each other;
    wherein the template has a pattern area on a first surface of a mesa;
    wherein mesa sidewalls surround the first surface of the mesa; and
    wherein the apparatus is configured to expose the mesa sidewalls to a first gas, wherein the first gas is configured to modify the mesa sidewalls during the first period;
    wherein the first position is such that the platter provides resistance to flow of the first gas towards the pattern area of the template during the first period;
    wherein the first position is such that a first gap is formed, wherein the first gap is bounded by at least, the platter, the mesa sidewalls, and a recessed surface of the template, further comprising:
    a gas controller including a valve, configured to supply the first gas; and
    a first set of one or more ports, which connect the gas controller to the first gap.

5. The apparatus according to claim 2, wherein the first position is such that a second gap is formed between the platter and the pattern area of the template, wherein the second gap provides resistance to the flow of the first gas in the first gap into the second gap.

6. The apparatus according to claim 2, wherein the first set of one or more ports are in the template held in the template chuck.

7. The apparatus according to claim 4, wherein the first gas is a reactive gas that either removes material from the mesa sidewalls, wherein the platter is configured to provide resistance to the flow of the reactive gas towards a coating on the pattern area.

8. The apparatus according to claim 4, further comprising exhaust ports for pulling gas from the first gap.

9. An apparatus comprising:
    a template chuck configured to hold a template;
    a platter;
    a positioning system, during a first period of time, configured to position the template chuck and the platter at a first position relative to each other;
    wherein the first position is such that the platter provides resistance to flow of the first gas towards the pattern area of the template during the first period wherein the first position is such that a first gap is formed, wherein the first gap is bounded by at least, the platter, the mesa sidewalls, and a recessed surface of the template;

a gas controller configured to supply the first gas; and a first set of one or more ports, which connect the gas controller to the first gap;

wherein the template has a pattern area on a first surface of a mesa;

wherein mesa sidewalls surround the first surface of the mesa; and wherein the apparatus is configured to expose the mesa sidewalls to a first gas, wherein the first gas is configured to modify the mesa sidewalls during the first period;

wherein the first gas is a precursor gas that becomes a reactive gas when exposed to ionizing radiation at which point the reactive gas reacts with material on the mesa sidewalls so as to remove material from the mesa sidewalls;

wherein the mesa sidewalls are exposed to the ionizing radiation;

wherein the platter protects the pattern area from the ionizing radiation when in the first position.

10. The apparatus according to claim 9, further comprising an ionizing radiation source.

11. A platter for modifying the mesa sidewalls of a template, the platter comprising:

a raised area;

a first region surrounding the raised area region; and a first gas source connected the first region configured to supply a first gas to the first region; and wherein the first gas source includes at least one gas port connected to the first region of the platter or at least one liquid well in the first region of the platter.

12. The platter according to claim 11, further comprises channel structures which provides resistance to the flow of the first gas away from the center of the platter.

13. The platter according to claim 11, further comprises a second set of one or more gas ports configured to supply a second gas different from the first gas, to the raised area.

14. The platter according to claim 13, further comprises channels in the raised area that are connected to the second set of one or more gas ports which guide the second gas towards edges of the raised area.

* * * * *